(12) United States Patent
Park et al.

(10) Patent No.: US 12,266,652 B2
(45) Date of Patent: Apr. 1, 2025

(54) SEMICONDUCTOR DEVICE

(71) Applicant: Samsung Electronics Co., Ltd., Suwon-si (KR)

(72) Inventors: Junmo Park, Seoul (KR); Yeonho Park, Seoul (KR); Kyubong Choi, Seoul (KR); Eunsil Park, Hwaseong-si (KR); Junseok Lee, Suwon-si (KR); Jinseok Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 506 days.

(21) Appl. No.: 17/691,293

(22) Filed: Mar. 10, 2022

(65) Prior Publication Data

US 2023/0014468 A1   Jan. 19, 2023

(30) Foreign Application Priority Data

Jul. 13, 2021   (KR) ........................ 10-2021-0091401

(51) Int. Cl.
*H01L 27/088* (2006.01)
*H01L 21/762* (2006.01)
*H01L 21/8234* (2006.01)

(52) U.S. Cl.
CPC ...... *H01L 27/088* (2013.01); *H01L 21/76232* (2013.01); *H01L 21/823418* (2013.01); *H01L 21/823481* (2013.01)

(58) Field of Classification Search
CPC . H01L 27/088; H01L 27/092; H01L 27/0886; H01L 21/76232; H01L 21/823418; H01L 21/823481; H01L 21/823807; H01L 21/823814; H01L 21/823431; H01L 21/823468; H01L 21/823878; H01L 21/823828; H01L 21/823857; H01L 21/823864; H01L 29/0673; H01L 29/165; H01L 29/7848; H01L 29/42392; H01L 29/66439; H01L 29/66545; H01L 29/775; H01L 29/78618; H01L 29/78696; H01L 29/0649; B82Y 10/00
See application file for complete search history.

(56) References Cited

U.S. PATENT DOCUMENTS 9,412,616 B1   8/2016   Xie et al.
9,536,991 B1   1/2017   Zang et al.
(Continued)

*Primary Examiner* — Sitaramarao S Yechuri
(74) *Attorney, Agent, or Firm* — Harness, Dickey & Pierce, P.L.C.

(57) ABSTRACT

A semiconductor device includes a substrate including a first active fin and a second active fin respectively extending in a first direction, the substrate having a recess between the first and second active fins, a device isolation film on the substrate, first and second gate structures on the first and second active fins, respectively, and extending in a second direction, and a field separation layer having a first portion between the first and second active fin and in the recess, and a second portion extending from both sides of the first portion in the second direction to an upper surface of the device isolation film. The recess has a bottom surface lower in a third direction intersecting the first direction and the second direction than the upper surface of the device isolation film, and a region of the upper surface of the device isolation film has a flat surface.

19 Claims, 42 Drawing Sheets

(56) References Cited

U.S. PATENT DOCUMENTS

| | | | |
|---|---|---|---|
| 9,570,442 | B1 | 2/2017 | Liu et al. |
| 10,388,652 | B2 | 8/2019 | Shi et al. |
| 10,522,410 | B2 | 12/2019 | Economikos et al. |
| 10,580,685 | B2 | 3/2020 | Zang et al. |
| 10,622,999 | B2 | 4/2020 | Song et al. |
| 10,910,376 | B2 | 2/2021 | Park et al. |
| 2014/0264572 | A1* | 9/2014 | Kim .................. H01L 29/66545 438/156 |
| 2017/0141211 | A1 | 5/2017 | Xie et al. |
| 2019/0027410 | A1* | 1/2019 | Liou ............... H01L 21/823878 |
| 2020/0227323 | A1 | 7/2020 | Zang et al. |
| 2021/0098627 | A1 | 4/2021 | Liaw |
| 2022/0037496 | A1* | 2/2022 | Chen .................. H01L 29/0673 |

* cited by examiner

SEMICONDUCTOR DEVICE

CROSS-REFERENCE TO RELATED APPLICATION(S)

This application claims the benefit under 35 USC 119(a) to Korean Patent Application No. 10-2021-0091401 filed on Jul. 13, 2021, in the Korean Intellectual Property Office, the entire disclosure of which is incorporated herein by reference in its entirety.

BACKGROUND

The present inventive concepts relate to semiconductor devices.

As demand for high performance, high speed, and/or multifunctional semiconductor devices increases, demand for high integration of semiconductor devices is also greatly increasing. When downscaling semiconductor devices, a short channel effect may occur in the transistors, and there may be a problem of reduced or deteriorated reliability of an integrated circuit device.

As the design scale decreases, the length of a gate and the length of a channel formed there below also decrease. Accordingly, to improve the operational stability and reliability of transistors, important factors determining the performance of integrated circuits, various methods for improving the manufacturing process and structure of integrated circuit devices are required.

SUMMARY

Example embodiments provide a semiconductor device having improved degrees of integration and performance.

According to example embodiments, a semiconductor device includes a substrate including a first active fin and a second active fin respectively extending in a first direction and arranged on a first line, the substrate having a recess between the first active fin and the second active fin; a device isolation film on the substrate and surrounding a portion of each of the first active fin and the second active fin; a first gate structure and a second gate structure on the first active fin and the second active fin, respectively, and extending in a second direction, intersecting the first direction; and a field separation layer having a first portion located between the first active fin and the second active fin and in the recess, and a second portion extending from both sides of the first portion in the second direction to an upper surface of the device isolation film. The recess has a bottom surface lower in a third direction intersecting the first direction and the second direction than the upper surface of the device isolation film, and a region in which the second portion of the field separation layer is located, among the upper surface of the device isolation film, has a flat surface.

According to example embodiments, a semiconductor device includes a substrate; a first active fin and a second active fin respectively extending in a first direction on the substrate, and arranged in a second direction intersecting the first direction; a device isolation film on the substrate and surrounding a portion of each of the first active fin and the second active fin; first and second recesses positioned adjacent to one ends of the first active fin and the second active fin in the substrate, and arranged on a second line with the first active fin and the second active fin in the first direction, respectively, each of the first active fin and the second active fin having a bottom surface lower in a third direction intersecting the first direction and the second direction than an upper surface of the device isolation film; first and second gate structures intersecting the first active fin and the second active fin, respectively, extending in the second direction, and arranged on a third line; a field separation layer having first portions positioned in the first and second recesses, and second portions extending from the first portions in the second direction on the upper surface of the device isolation film, regions of the upper surface of the device isolation film, in which the second portions are located, having a flat surface; and a gate isolation pattern between the first and second gate structures and including the same material as a material of the field separation layer.

According to example embodiments, a semiconductor device includes a substrate; a first active fin and a second active fin respectively extending in a first direction on the substrate, and on a first line; a third active fin and a fourth active fin respectively extending in the first direction on the substrate, and on a second line; a device isolation film on the substrate and surrounding a portion of each of the first to fourth active fins; first and second gate structures intersecting the first and fourth active fins, respectively, and extending in a second direction intersecting the first direction; a first recess positioned between the first active fin and the second active fin in the substrate, and on a third line as the second gate structure in the second direction; a second recess positioned between the third and fourth active fins in the substrate and on a fourth line with the first gate structure in the second direction; a first field separation layer having a first portion positioned in the first recess, and a second portion extending from the first portion on an upper surface of the device isolation film in the second direction; and a second field separation layer having a third portion positioned in the second recess, and a fourth portion extending from the third portion on the upper surface of the device isolation film in the second direction. Each of the first and second recesses has a bottom surface lower in a third direction intersecting the first direction and the second direction than the upper surface of the device isolation film, and regions of the upper surface of the device isolation film, in which the second and fourth portions are located, have flat surfaces, the first field separation layer having a region overlapping the second field separation layer in the first direction.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 7A to 13A and 7B to 13B are cross-sectional views illustrating main processes to describe a method of manufacturing a semiconductor device according to an example embodiment, respectively;

DETAILED DESCRIPTION

Hereinafter, various embodiments will be described in detail with reference to the accompanying drawings.

Figure 1:
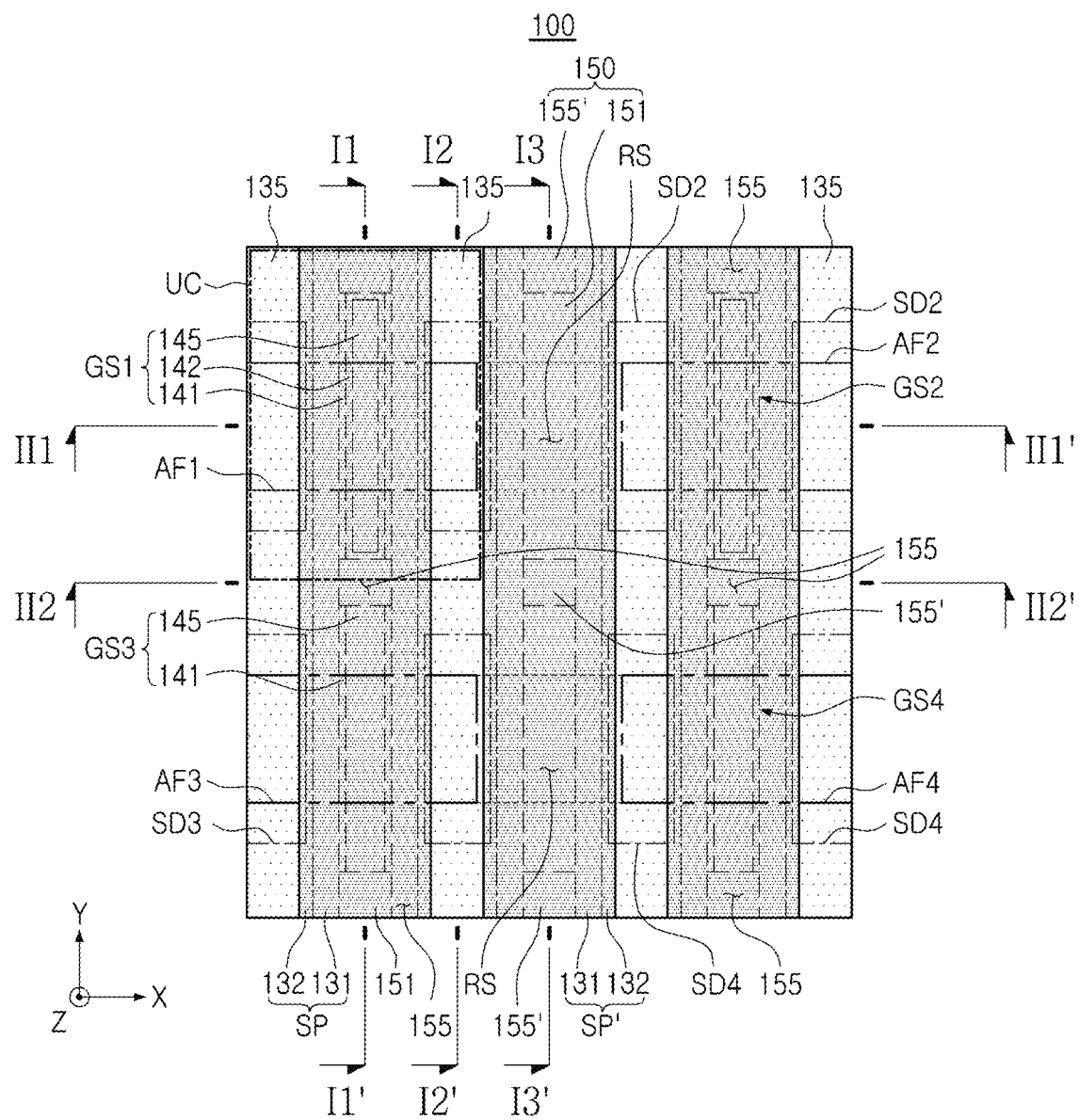
FIG. 1 is a plan view illustrating a semiconductor device according to an example embodiment.
Figure 2A:
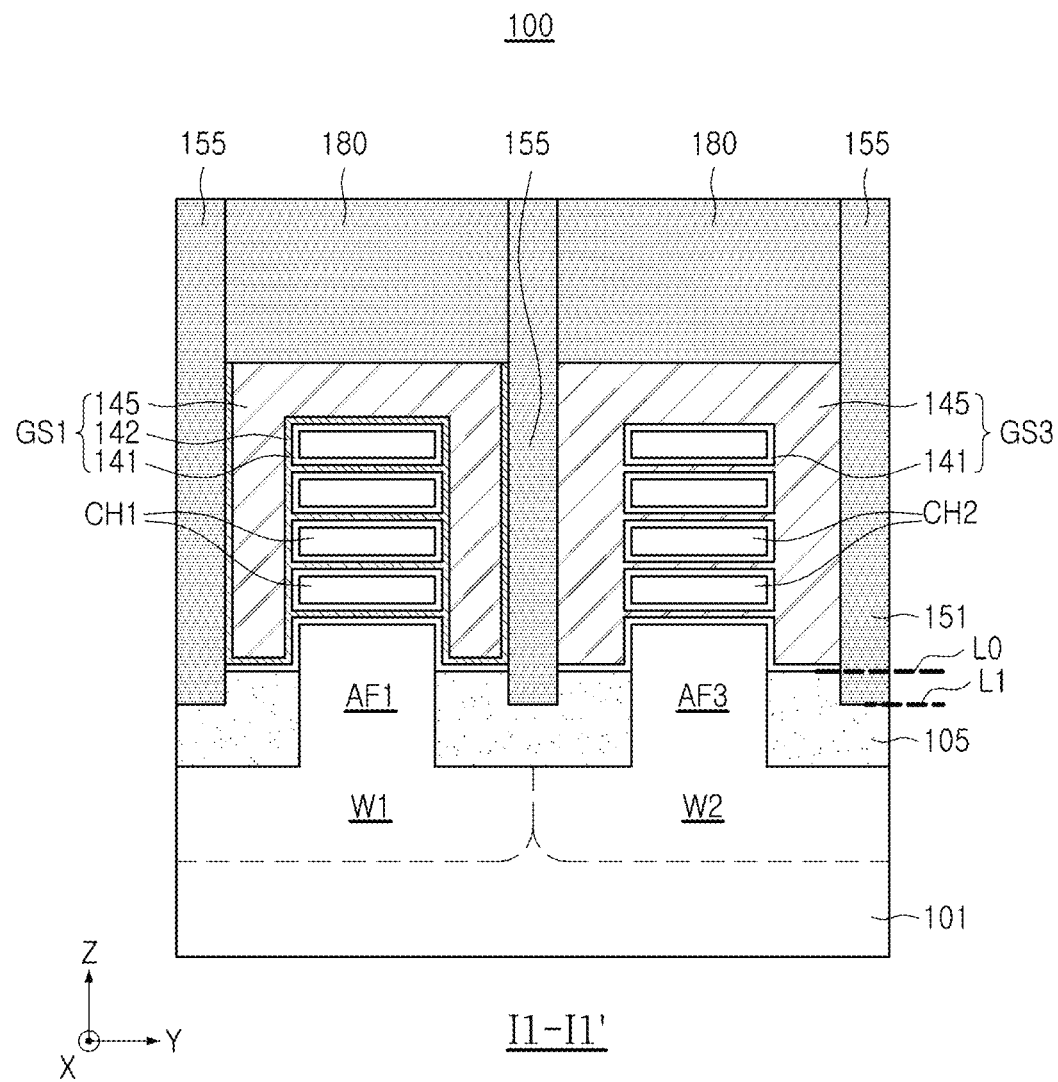
FIGS. 2A to 2C are cross-sectional views of the semiconductor device illustrated in FIG. 1, taken along lines I1-I1', I2-I2', and I3-I3', respectively.
Figure 2B:
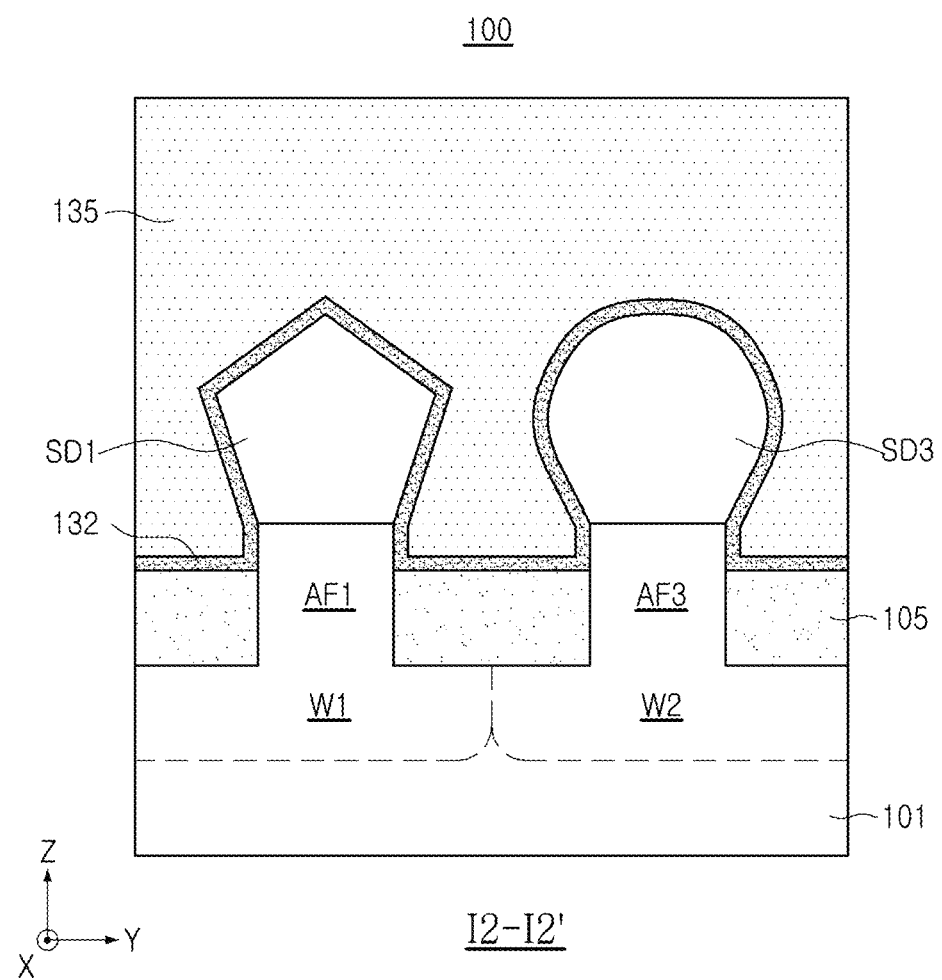
Figure 2C:
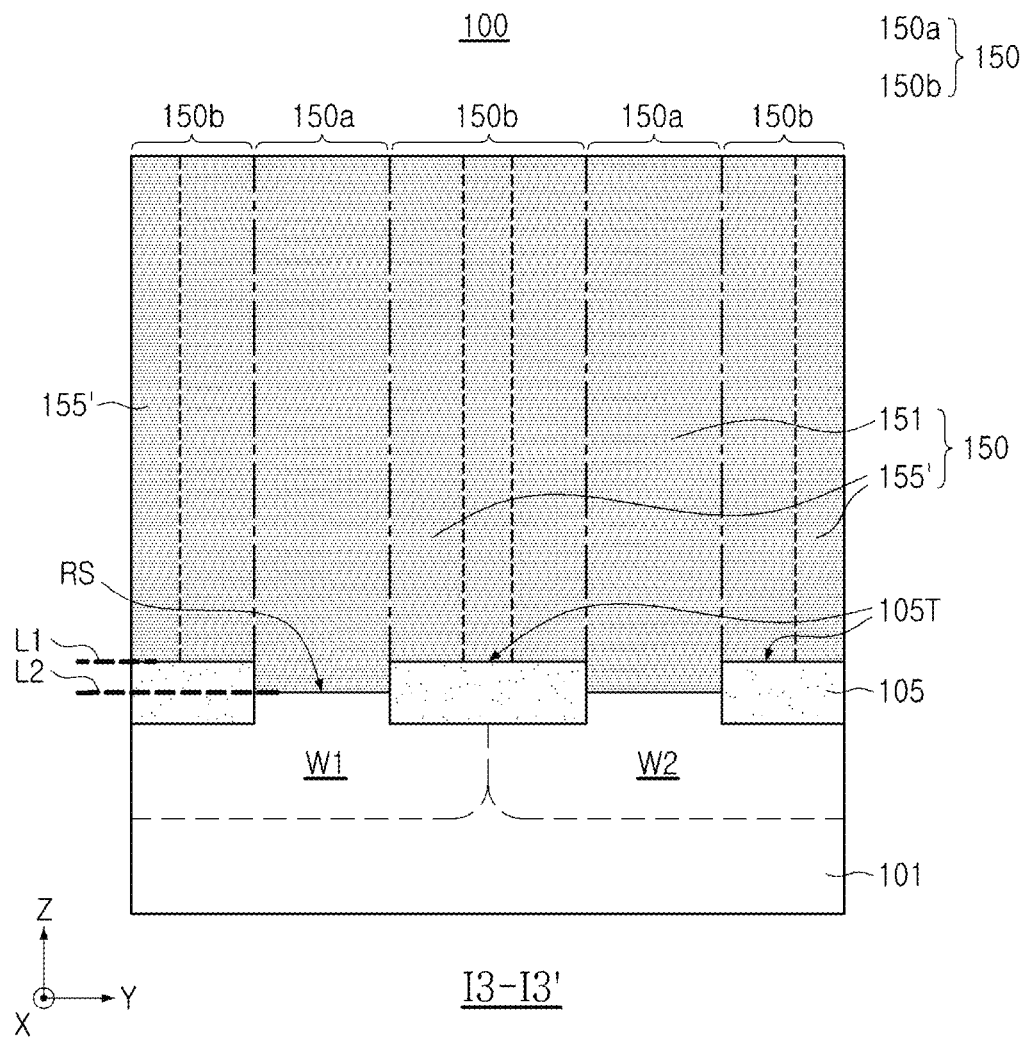
Figure 3A:
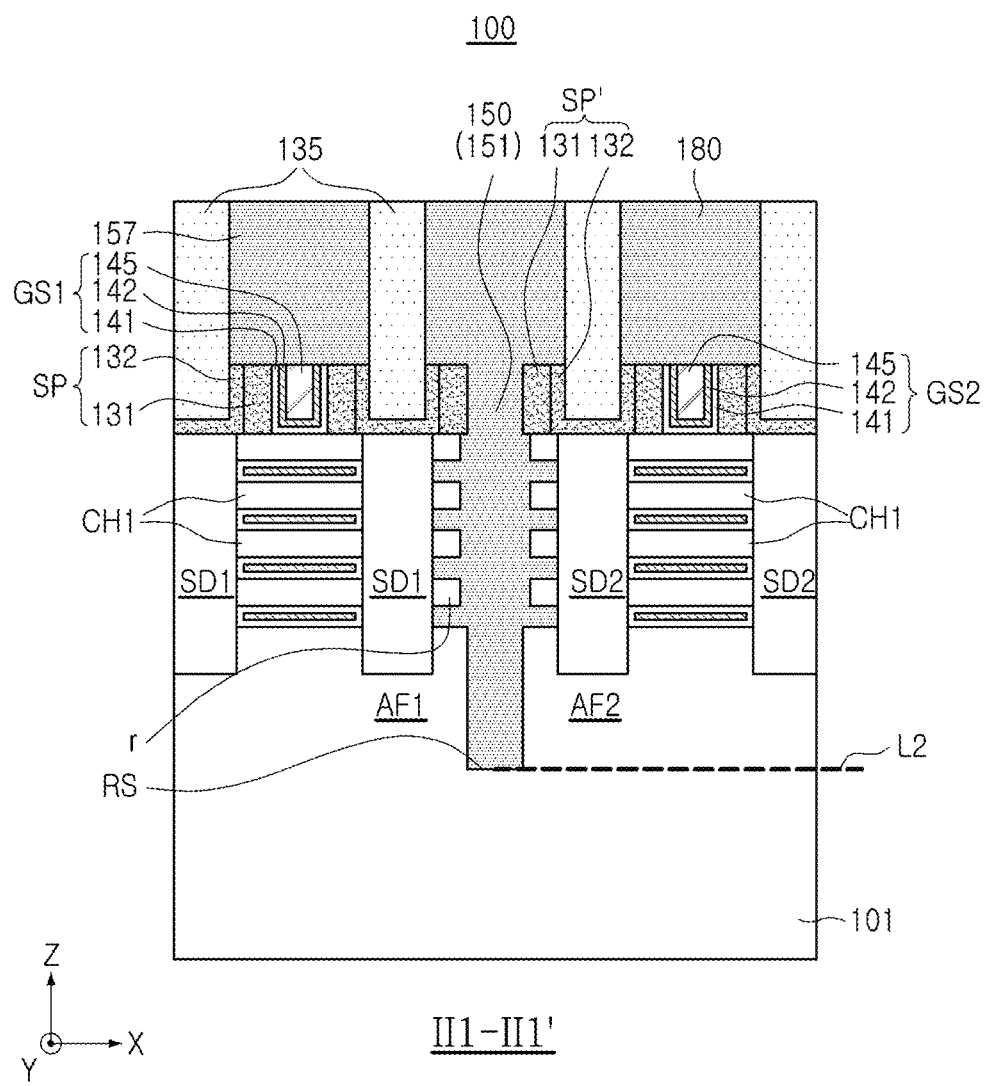
FIGS. 3A and 3B are cross-sectional views of the semiconductor device illustrated in FIG. 1, taken along lines II1'-II1' and II2-II2', respectively.
Figure 3B:
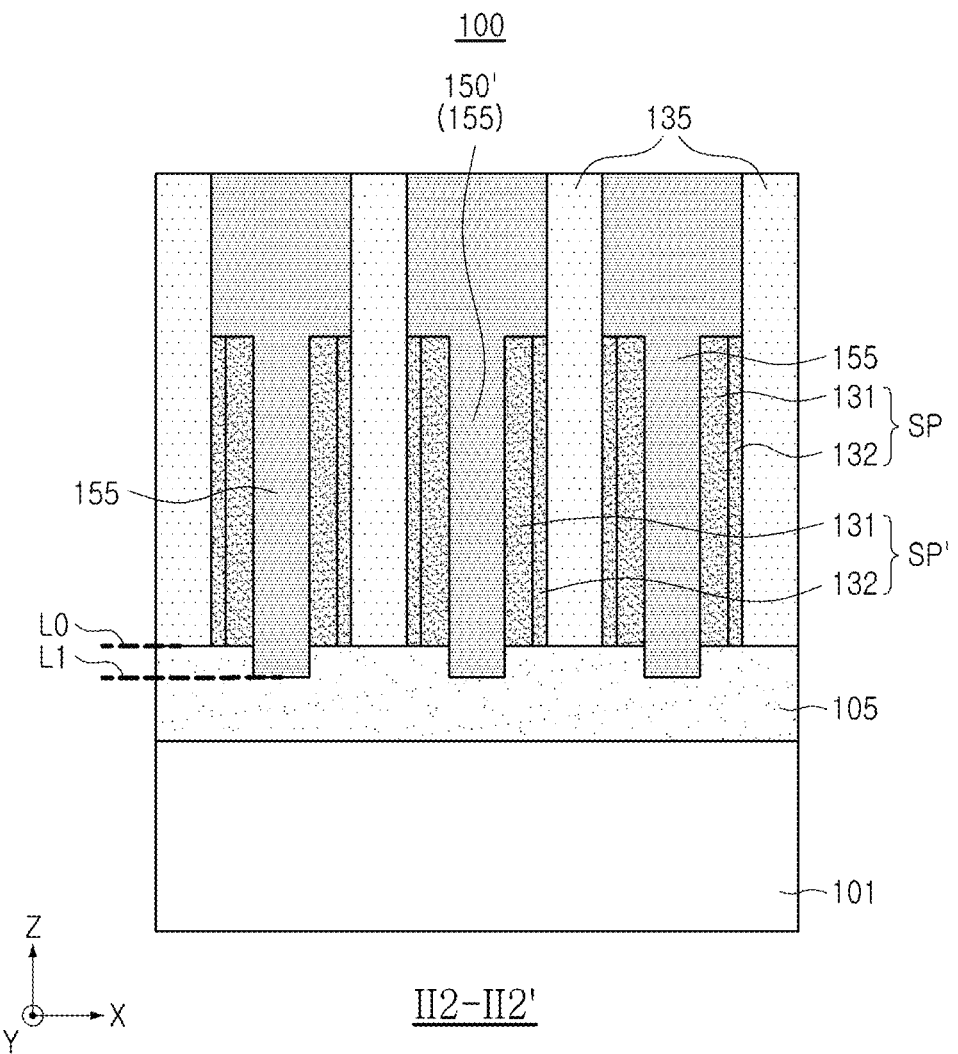

FIG. 1 is a plan view illustrating a semiconductor device according to an example embodiment, and FIGS. 2A to 2C are cross-sectional views of the semiconductor device illustrated in FIG. 1, taken along lines I1-I1', I2-I2' and I3-I3', respectively. FIGS. 3A and 3B are cross-sectional views of the semiconductor device illustrated in FIG. 1, taken along lines II1-II1' and II2-II2', respectively.

Referring to FIGS. 1, 2A to 2C, and 3A and 3B, a semiconductor device 100 according to an example embodiment may include a substrate 101, first and second active fins AF1 and AF2 extending in a first direction (e.g., X direction) on the substrate 101 and arranged on one line (first line), third and fourth active fins AF3 and AF4 extending in the first direction on the substrate 101 and arranged on another line (second line), and first to fourth gate structures GS1 to GS4 on the first to fourth active fins AF1 to AF4, respectively, and extending in a second direction (e.g., Y direction) intersecting the first direction.

In addition, in the semiconductor device 100, a plurality of first and second channel layers CH1 and CH2 may be on the first to fourth active fins AF1 to AF4, respectively, and may be spaced apart from each other in a third direction (e.g., Z direction) perpendicular to the upper surface of the substrate 101; and first to fourth source/drain regions SD1 to SD4 may be on both sides of first to the fourth gate structures GS1 to GS4 to contact the plurality of first and second channel layers CH1 and CH2, respectively. The Z direction (third direction) may define up and down and comparisons of being above and below, or upper or lower, may be made in the Z direction.

In the present embodiment, the first to fourth active fins AF1 to AF4 have a fin structure extending in the first direction (e.g., X direction) and protruding in the third direction (e.g., Z direction). For example, the substrate 101 may be a semiconductor substrate such as a silicon substrate or a germanium substrate, or a silicon-on-insulator (SOI) substrate. The first to fourth active fins AF1 to AF4 may be formed in a conductivity-type semiconductor region such as a well doped with an impurity or a structure doped with an impurity. For example, the first and second active fins AF1 and AF2 may be formed in an n-type well W1 for a P-MOS transistor, and the third and fourth active fins AF3 and AF4 may be formed in a p-type well W2 for an N-MOS transistor.

A device isolation film 105 defines first to fourth active fins AF1 to AF4. Referring to FIGS. 2A and 2B, the device isolation film 105 may be on the substrate 101 to cover respective side surfaces of the first to fourth active fins AF1 to AF4. The device isolation film 105 may be disposed in such a manner that upper regions of the first to fourth active fins AF1 to AF4 are exposed. In some embodiments, the device isolation film 105 may also have a curved upper surface of which a level is increased adjacent to the first to fourth active fins AF1 to AF4. The device isolation film 105 may be formed by a shallow trench isolation (STI) process. In some embodiments, the device isolation film 105 may further include a region (e.g., deep trench isolation (DTI)) extending deeper into the substrate 101. For example, the device isolation film 105 may include an oxide layer, a nitride layer, or a combination thereof.

Referring to FIGS. 2A and 3A together with FIG. 1, the first to fourth gate structures GS1 to GS4 may include a gate electrode 142, 145 or 145 each extending in the second direction (e.g., the Y direction) and surrounding the plurality of first and second channel layers CH1 and CH2, a gate insulating layer 141 positioned between the plurality of first and second channel layers CH1 and CH2 and the gate electrode 142, 143 or 145, and a gate spacer SP on both sides of the gate electrode 145. A gate capping layer 155 may be on the first to fourth gate structures GS1 to GS4. As described above, the semiconductor device 100 according to the present example embodiment may include a gate-all-around type field effect transistor. A cross-section of the fourth gate structure GS4 is not illustrated, but may be understood as having a structure similar to a structure (e.g., a gate for an N-MOS transistor) of the first gate structure GS3 as described above.

In the present embodiment, the gate spacer SP may include a first layer 131 (also referred to as a "sidewall insulating layer") positioned on both sides of the gate electrode 142, 145 or 145, and a second layer 132 (referred to as an "etch stop layer") on the first layer 131. The second layer 132 may be on an upper surface of the device isolation film 105 excluding the first to fourth gate structures GS1 to GS4, and on the first to fourth source/drain regions SD1 to SD4 excluding the contact region (refer to FIGS. 4A and 4B), and may be used as an etch stop layer in a subsequent process (e.g., formation of the first and second contact structures). For example, at least one of the first layer 131 and the second layer 132 may be formed of an insulating material such as silicon nitride ($SiN_a$), silicon oxynitride ($SiO_bN_c$), silicon carbonitride ($SiC_dN_e$), or silicon oxycarbonitride ($SiO_xC_yN_z$) For example, the gate insulating layer 141 may include at least one of a silicon oxide layer, a silicon nitride layer, a silicon oxynitride layer, or a high-k layer. The high-k layer may include a material having a higher dielectric constant than that of a silicon oxide layer, such as a hafnium oxide layer (HfO), an aluminum oxide layer (AlO), or a tantalum oxide layer (TaO).

The gate electrodes 142 and 145 may include a conductive material, and for example, may include a metal nitride such as titanium nitride (TiN), tantalum nitride (TaN), or tungsten nitride (WN), and/or a metallic material such as aluminum (Al), tungsten (W) or molybdenum (Mo) or a semiconductor material such as doped polysilicon. In some embodiments, the gate electrodes 142 and 145 may be formed of two or more multi-layers, like the electrodes of the first and third gate structures GS1 and GS3.

An interlayer insulating layer 135 may be on the substrate 101 to cover the first to fourth source/drain regions SD1 to SD4 and the first to fourth gate structures GS1 to GS4. In some regions, the interlayer insulating layer 135 may be on the device isolation film 105. For example, the interlayer insulating layer 135 may include a low-k material such as silicon oxide. Examples of the low-k material may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or combinations thereof.

In this embodiment, referring to FIGS. 1 and 2A, the first and third gate structures GS1 and GS3 are arranged side by side on one line in the second direction, and the second and fourth gate structures GS1 and GS3 are arranged side by side on another line in the second direction. The first and third gate structures GS1 and GS3 may be separated by a gate isolation pattern 155, and the second and fourth gate structures GS2 and GS4 may be separated by the gate isolation pattern 155.

Referring to FIGS. 1 and 3A, the first and second active fins AF1 and AF2 may be structures obtained by dividing one fin structure into field separation layers 150, and similarly, the third and fourth active fins AF3 and AF4 may also be structures obtained by dividing another fin structure into field separation layers 150.

The field separation layer 150 employed in this embodiment may be illustrated as a separation structure for two fin structures adjacent to each other in the second direction (e.g., the Y direction). Referring to FIG. 1, the field separation layer 150 may be understood to be an integrated structure in which a structure separating the first and second active fins AF1 and AF2 and a structure separating the third and fourth active fins AF3 and AF4 are integrated.

Referring to FIGS. 1, 2C, and 3A, the substrate 101 may have a recess RS respectively formed between the first and second active fins AF1 and AF2 and between the third and fourth active fins AF3 and AF4, respectively.

As illustrated in FIG. 3A, the recess RS may be obtained by removing the plurality of channel layers CH1 and a partial region of the fin structure into the substrate 101. In addition, the field separation layer 150 may be formed by filling the recess RS and a region around the recess RS with an insulating material. In some embodiments, a portion (r) of the plurality of channel layers may remain. Accordingly, the first and second active fins AF1 and AF2 separated electrically may be provided from one fin structure. Similarly, after the recess RS is formed between the third and fourth active fins AF3 and AF4, the field separation layer 150 may be formed.

As illustrated in FIG. 3A, the field separation layer 150 may be positioned between adjacent source/drain regions (e.g., SD1 and SD2). The field separation layer 150 may have a lower surface lower than the adjacent source/drain regions (e.g., SD1 and SD2).

Referring to FIGS. 1 and 2C, the field separation layer 150 employed in this embodiment is positioned between the adjacent active fins AF1 and AF2 or between AF3 and AF4, and may include a first portion 150a in the recess RS and a second portion 150b extending from both sides of the first portion 150a in the second direction (e.g., Y direction) to an upper surface 105T of the device isolation film 105. Also, a region of the upper surface 105T of the device isolation film 105, in which the second portion 150b of the field separation layer 150 is located, may have a flat surface. Also, the bottom surface of the recess RS may have a level L2 lower than an upper surface L1 of the device isolation film 105.

As illustrated in FIGS. 3A and 3B, the semiconductor device 100 may further include a pair of sidewall spacers SP' on both side surfaces opposing each other in the first direction (e.g., the X direction), respectively, among side surfaces of the field separation layer 150. The sidewall spacers SP' may be regions extending from the gate spacers SP. The sidewall spacers SF may include the same material as the gate spacers SP. The sidewall spacers SP' may be on a region of the upper surface of the device isolation film 105, which is adjacent to the recess RS.

Referring to FIGS. 2A and 2C together with FIG. 1, the width of the field separation layer 150 in the first direction (e.g., the X direction) may be greater than the width of each of the first and third gate structures GS1 and GS3 in the first direction. The field separation layer 150 may be divided into a diffusion barrier region 151 overlapping adjacent gate structures, and a separation region 155' overlapping the adjacent gate isolation pattern 155 in the second direction. In the present embodiment, since the diffusion barrier region 151 is formed in the same process as the separation region 155', as described above, the upper surface of 105T of the device isolation film 105 in which the second portion 150b including the separation region 155' is formed, may have a flat surface.

The field separation layer 150 may be formed together with the gate isolation pattern 155. The lower surface of the gate isolation pattern 155 may have a lower surface at the same level L1 as the lower surface of the second portion 150b of the field separation layer 150 (refer to FIGS. 2A, 2C, and 3B). The gate isolation pattern 155 may include the same material as that of the field separation layer 150. For example, the field separation layer 150 and the gate isolation pattern 155 may include silicon nitride ($SiN_a$), silicon oxynitride ($SiO_bN_c$), silicon carbonitride ($SiC_dN_e$), or silicon oxycarbonitride ($SiO_xC_yN_z$).

Referring to FIGS. 2A and 3B, a region of the upper surface of the device isolation film 105, in which the second portion 150b of the field separation layer 150 is located, may have the level L1 lower than a level L0 of a region of the upper surface of the device isolation film 105, in which the first to fourth gate structures GS1 to GS4 are located.

The field separation layer 150 employed in this embodiment is formed together with the gate isolation pattern 155 after the dummy gate electrode is removed (refer to FIG. 5H), and the field separation layer 150 may include the separation region 155' overlapping the adjacent gate isolation pattern 155. In another aspect, when compared to the width in the second direction, the field separation layer 150 may have a width greater than the width of the adjacent gate structures in the first direction.

As described above, since the gate isolation pattern 155 and the separation region 155' are not formed in advance before the formation of the field separation layer 150, the shadowing effect caused by the separation region 155' during the formation of the field separation layer may be eliminated. On the other hand, since the interlayer insulating layer 135 is protected by an ILD protective layer 170 (e.g., SiN) during the formation of the field separation layer 150, loss of the interlayer insulating layer 135 may be prevented even in a scaled condition.

In this embodiment, the first and second gate structures GS1 and GS2 may constitute a P-MOS transistor together with the plurality of first channel layers CH1 on the first and second active fins AF1 and AF2, and the first and second source/drain regions SD1 and SD2, respectively, and the third and fourth gate structures GS3 and GS4 may constitute an N-MOS transistor together with the plurality of second channel layers CH2 on the third and fourth active fins AF3 and AF4, and the third and fourth source/drain regions SD3 and SD4, respectively.

In detail, referring to FIGS. 2A and 3A, the first and second gate structures GS1 and GS2 may include first and second gate electrode layers 142 and 145 formed of different materials. The first gate electrode layer 142 may be on the first and second active fins AF1 and AF2, respectively, and may be to surround the plurality of first channel layers CH1, and the second gate electrode layer 145 may be on the first gate electrode layer 142. The third and fourth gate structures GS3 and GS4 may include a second gate electrode layer 145 as a gate electrode, and the second gate electrode layer 145 may be on the third and fourth active fins AF3 and AF4, respectively, and may be to surround the plurality of second channel layers CH2.

In the present embodiment, the first gate electrode layer 142 of the first and second gate structures GS1 and GS2 may be extended between the sidewall of the field insulating layer 150 (in detail, the gate isolation pattern 155) and the second gate electrode layer 145. As illustrated in FIG. 2A, the first gate electrode layer 142 may be on a side surface of the second gate electrode layer 145 facing the gate isolation pattern 155.

Referring to FIGS. 1 and 2B, exposed portions of the first to fourth active fins AF1 to AF4 positioned on both sides of the first to fourth gate structures GS1 to GS4, respectively, may have a recessed region. Epitaxially regrown first to fourth source/drain regions SD1 to SD4 may be in the recessed regions of the first to fourth active fins AF1 to AF4, respectively. Also, as illustrated in FIG. 3A, the first and second source/drain regions SD1 and SD2 may be formed to contact both side surfaces of the plurality of first and second channel layers CH1 and CH2, respectively. Although not illustrated, similarly, the third and fourth source/drain regions SD3 and SD4 may be formed to contact both side surfaces of the plurality of first and second channel layers CH1 and CH2 in the first direction (X direction), respectively.

In a cross-section (see FIG. 2A) in the second direction (e.g., the Y direction), the plurality of first and second channel layers CH1 and CH2 may have the same width as or similar to that of the first to fourth active fins AF1 to AF4. In a cross-section (see FIG. 3A) in the first direction (e.g., the X direction), the widths of the first to fourth gate structures GS1 to GS4 may be the same as or similar to those of the first to fourth gate structures GS1 to GS4. In some embodiments, the plurality of first and second channel layers CH1 and CH2 may have a width narrower than widths of the first to fourth gate structures GS1 to GS4, respectively, such that side surfaces of the plurality of first and second channel layers CH1 and CH2 are positioned below the first to fourth gate structures GS1 to GS4, respectively.

The plurality of first and second channel layers CH1 and CH2 may include a semiconductor material capable of providing a channel region. For example, the plurality of first and second channel layers CH1 and CH2 may include at least one of silicon (Si), silicon germanium (SiGe), and germanium (Ge). The plurality of first and second channel layers CH1 and CH2 may be formed of, for example, the same material as that of the substrate 101.

For example, in the case of a P-MOS transistor, the first and second source/drain regions SD1 and SD2 may include a material that provides a compressive strain to the first channel layers CH1. For example, the first and second source/drain regions SD1 and SD2 may include a SiGe layer having a lattice constant greater than that of Si. The first and second source/drain regions SD1 and SD2 may have a p-type conductivity. On the other hand, in the case of an N-MOS transistor, the third and fourth source/drain regions SD3 and SD4 may include a semiconductor material that provides a tensile strain to the second channel layers CH2. For example, the third and fourth source/drain regions SD3 and SD4 may include a SiC layer having a lattice constant less than that of Si, or a Si layer having substantially the same lattice constant as the substrate 101. The third and fourth source/drain regions SD3 and SD4 may have an n-type conductivity type.

Referring to FIG. 2B, the first and third source/drain regions SD1 and SD3 may have various shapes defined as crystallographically stable surfaces during the growth process. A cross-section of the first source/drain regions SD1 may have a pentagonal shape, and a cross-section of the second source/drain regions SD3 may have a hexagonal shape or a polygonal shape having a gentle angle. Although not illustrated, the second and fourth source/drain regions SD2 and SD4 may have shapes similar to those of the first and third source/drain regions SD1 and SD3, respectively.

In this embodiment, the field separation layer 150 is illustrated as a structure that separates two adjacent fin structures. In detail, the field separation layer 150 is illustrated to having a form extending in the second direction (e.g., Y direction) not only between the first and second active fins AF1 and AF2 but also between the third and fourth active fins AF3 and AF4, but may also be provided as a single structure (see FIG. 22) or as a structure for separating three or more adjacent fin structures.

In addition, although the first and second gate structures GS1 and GS2 are illustrated as having a configuration of a conductive type transistor different from that of the third and fourth gate structures GS3 and GS4, the present inventive concepts are not limited thereto. For example, the first gate structure GS1 and the second gate structure GS2 and/or the third gate structure GS3 and the fourth gate structure GS4 may be comprised of transistors of the same conductivity type formed in the same conductivity type well.

Figure 4A:
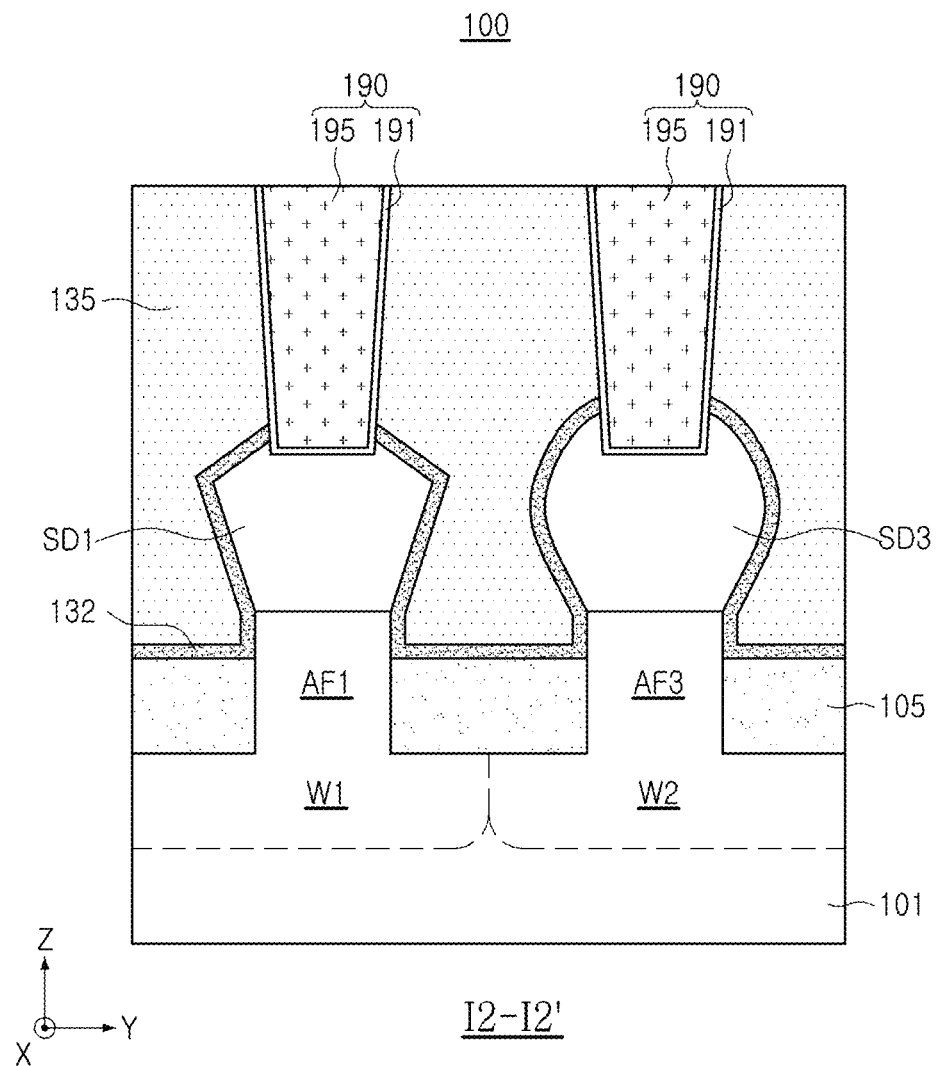
FIGS. 4A and 4B are cross-sectional views each illustrating a semiconductor device according to an example embodiment.
Figure 4B:
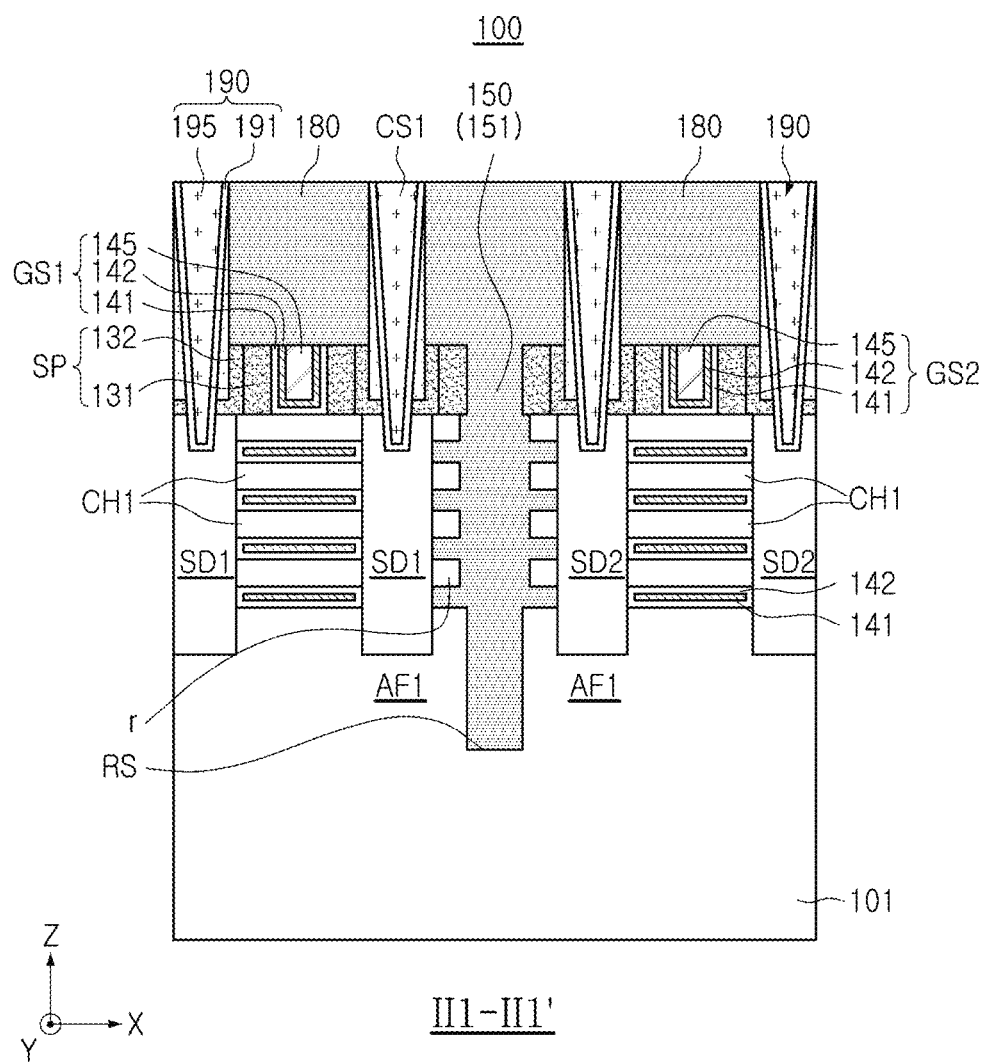

FIGS. 4A and 4B are cross-sectional views illustrating a semiconductor device 100 according to an example embodiment, respectively.

Referring to FIGS. 4A and 4B, the semiconductor device 100 according to the present embodiment may further include contact structures 190 respectively connected to the first to fourth source/drain regions SD1 to SD4. FIGS. 4A and 4B may be understood as cross-sections corresponding to FIGS. 2B and 3B, respectively.

The contact structures 190 may pass through the interlayer insulating layer 135 to be respectively connected to the first to fourth source/drain regions SD1 to SD4. Each of the contact structures 190 may include a conductive barrier 191 and a contact plug 195 on the conductive barrier 191. The contact structures 190 may provide a silicide film to be formed in contact regions of the first to fourth source/drain regions SD1 to SD4 to improve contact resistance with the first to fourth source/drain regions SD1 to SD4. In some embodiments, the conductive barrier 191 may be a conductive metal nitride film. For example, the conductive barrier 191 may include TiN, TaN, AlN, WN, or combinations thereof. The contact plug 195 may include tungsten (W), cobalt (Co), titanium (Ti), alloys thereof, or combinations thereof. In the present embodiment, since loss of the interlayer insulating layer 135 may be prevented in the process of forming the field separation layer and the gate isolation pattern, the contact short circuit problem in the self-forming process of the contact structures 190 may be effectively prevented.

FIGS. 5A to 5H are cross-sectional views of some processes (forming an active fin and a source/drain and removing a dummy gate material) illustrating a method of manufacturing a semiconductor device according to an example embodiment.

Figure 5A:
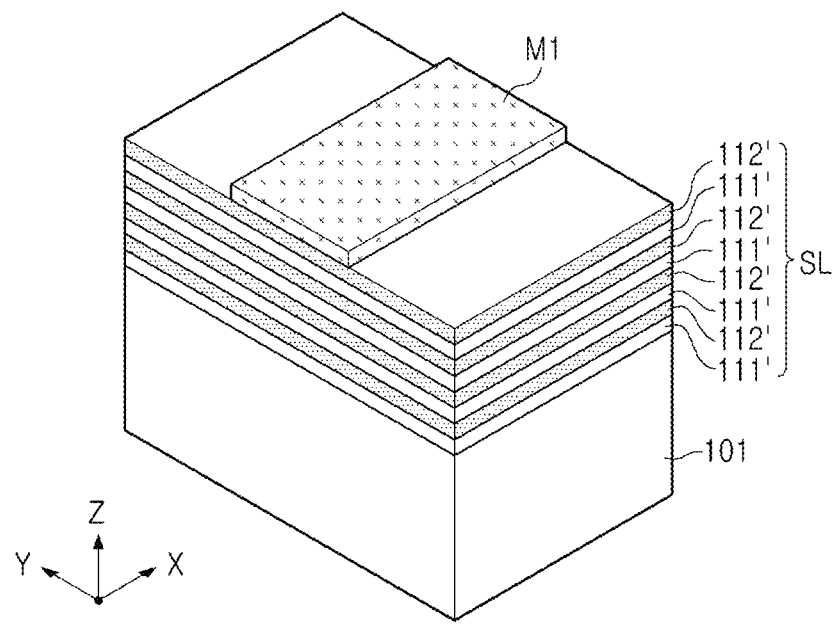
FIGS. 5A to 5H are cross-sectional views of some processes (forming an active fin and a source/drain, and removing a dummy gate material) illustrating a method of manufacturing a semiconductor device according to an example embodiment.
Figure 5B:
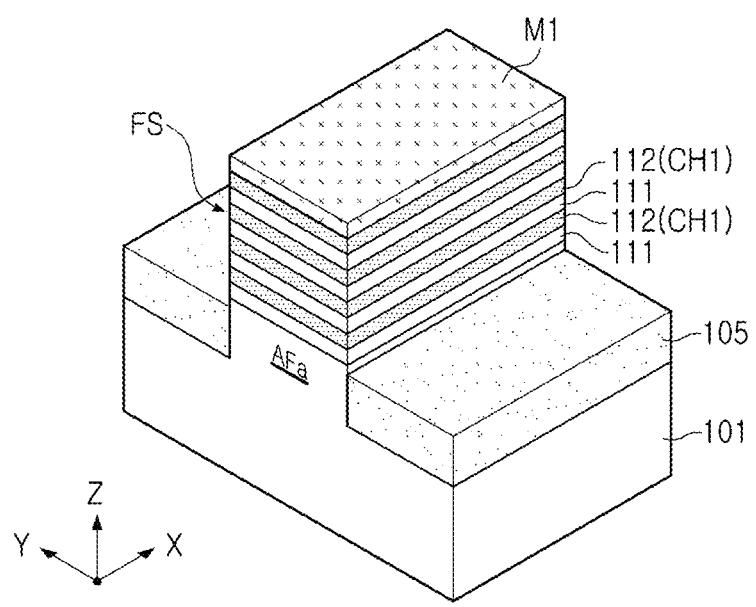
Figure 5C:
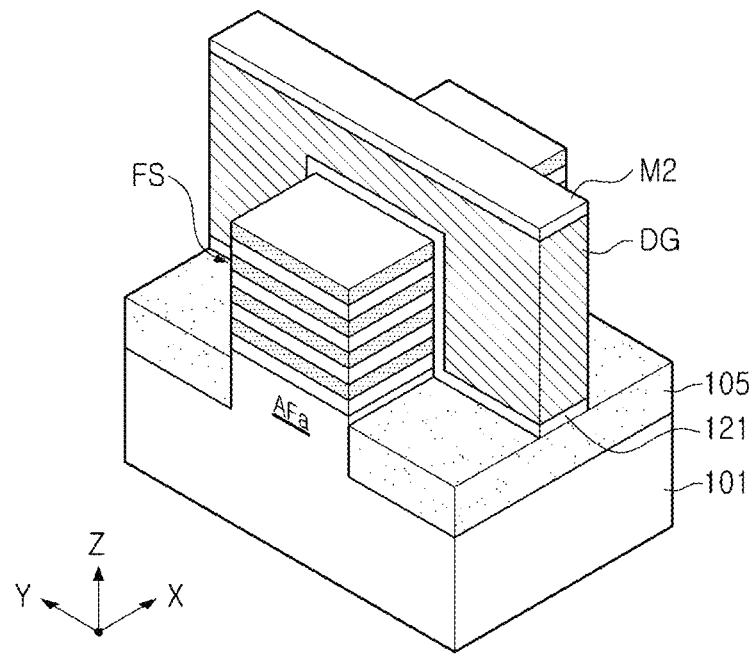
Figure 5D:
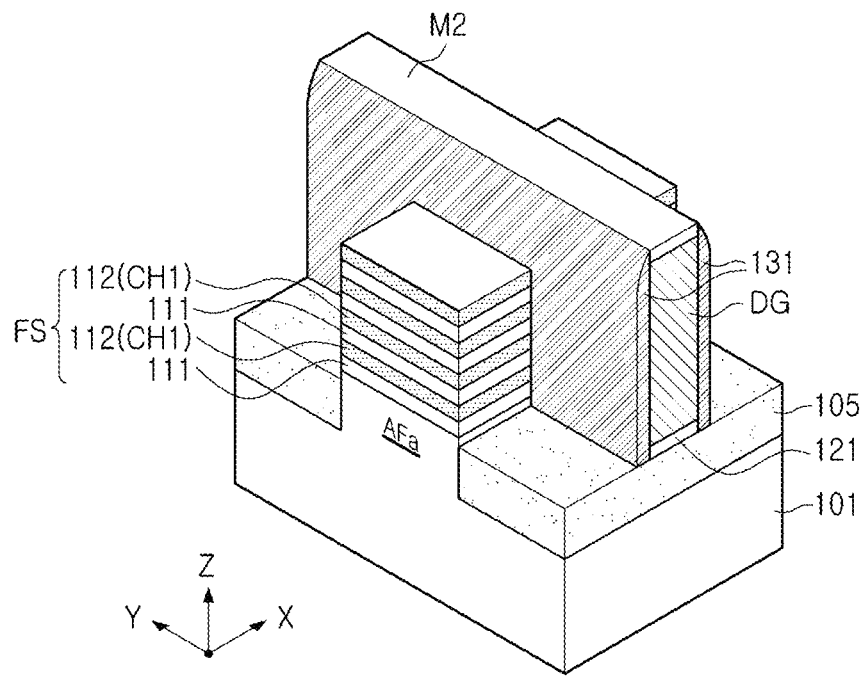
Figure 5E:
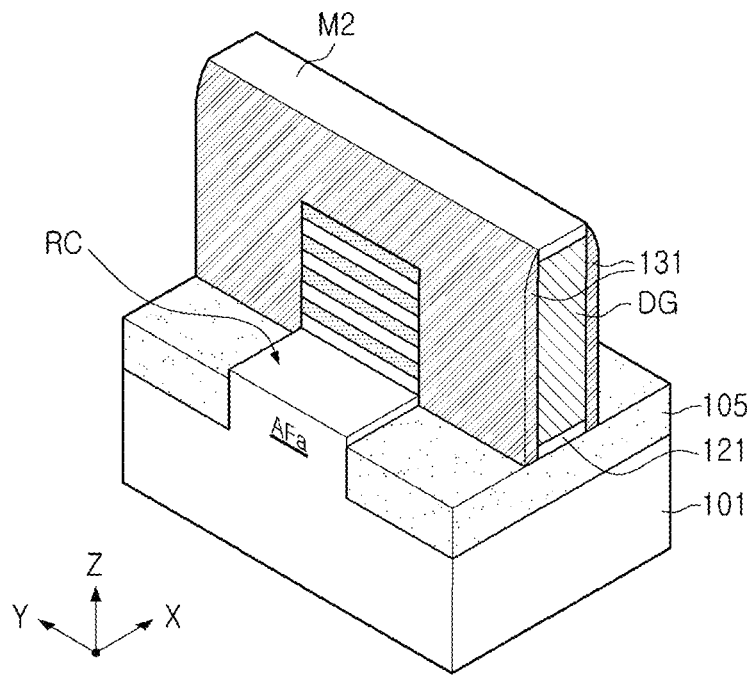
Figure 5F:
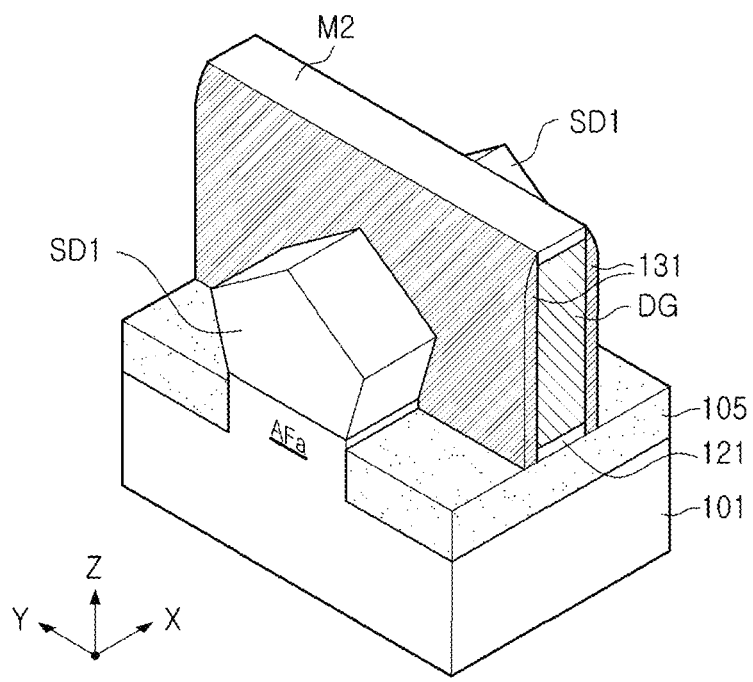
Figure 5G:
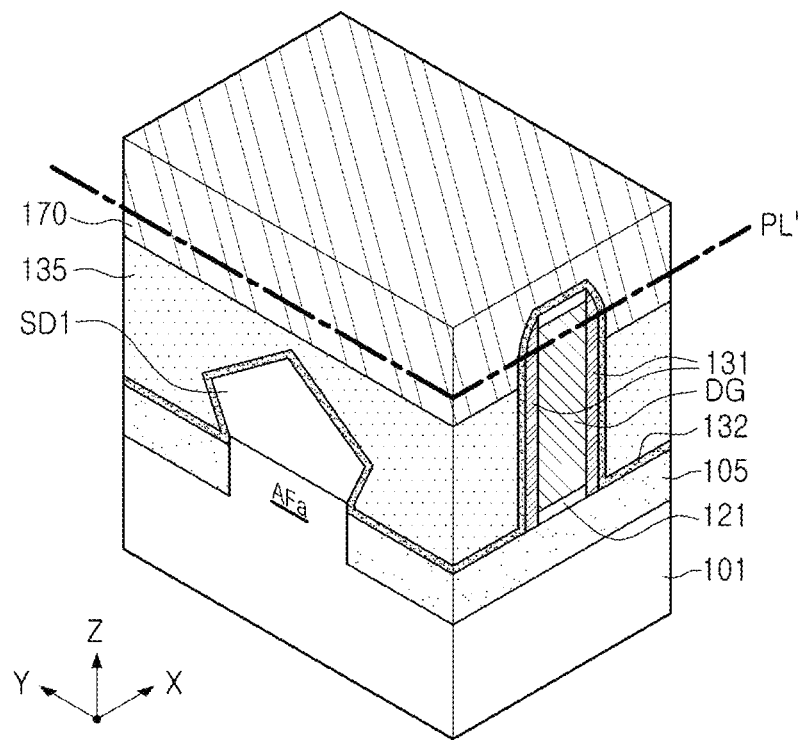
Figure 5H:
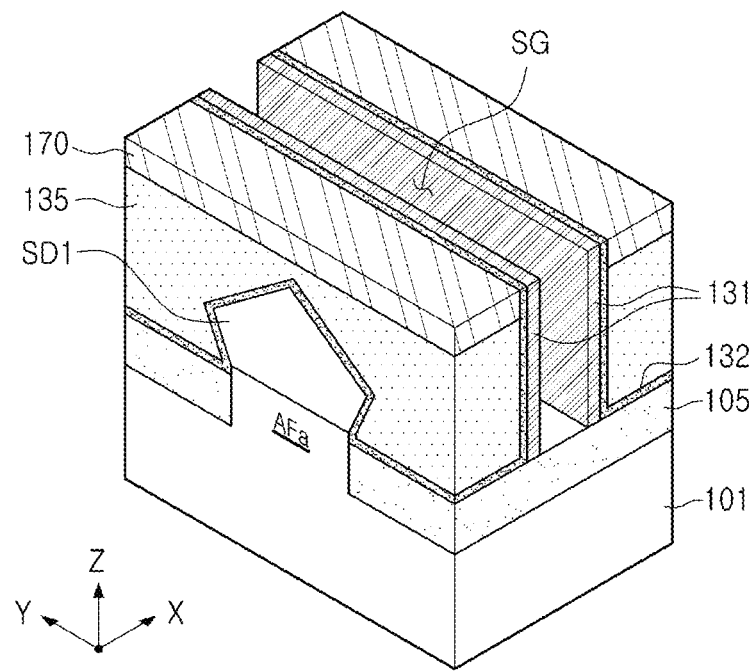
Figure 6:
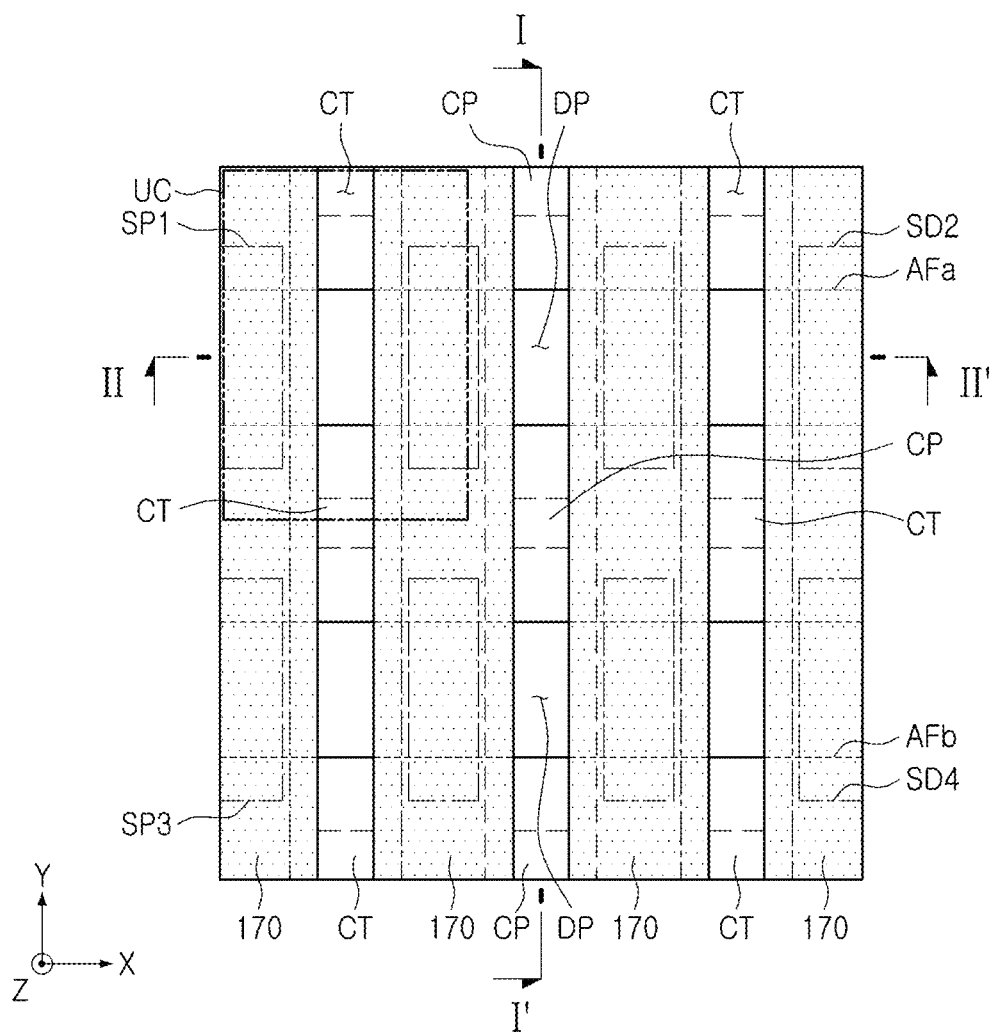
FIG. 6 is a plan view illustrating a semiconductor device according to an example embodiment.

The perspective views illustrated in FIGS. 5A to 5H illustrate only the unit cell UC constituting one transistor of the semiconductor device 100 illustrated in FIGS. 1 and 6 for convenience of description, and other cells may also be performed in the same process.

Referring to FIG. 5A, a stack structure SL in which a first semiconductor layer 111' and a second semiconductor layer 112' are alternately stacked may be formed on a substrate 101.

Second semiconductor layers 112' and first semiconductor layers 111' are alternately formed on the first semiconductor layer 111' in contact with the substrate 101, and an uppermost layer may be the second semiconductor layer 112', but the configuration is not limited thereto. For example, the first semiconductor layers 111' and the second semiconductor layers 112' may be formed using an epitaxial growth method. The first semiconductor layers 111' and the second semiconductor layers 112' may respectively include a material having different etch selectivity. For example, the first semiconductor layers 111' may be used as a sacrificial layer providing a space for forming a gate electrode, and the second semiconductor layers 112' may be used as a channel layer. In this case, even when the first semiconductor layers 111' are etched, the second semiconductor layers 112' may remain almost unetched. For example, the first semiconductor layers 111' may include SiGe, and the second semiconductor layers 112' may include either Si or a group III-V compound semiconductor. Next, a first mask pattern M1 extending in a first direction (e.g., X direction) is formed on the stack structure. The first mask pattern M1 may be formed of at least one of, for example, a silicon oxide layer, a silicon nitride layer, and a silicon oxynitride layer.

Next, referring to FIG. 5B, the stack structure may be etched using the first mask pattern M1 to form a first fin structure AFa and a stack pattern FS.

In the present embodiment, the stack pattern FS is a stack structure of a first semiconductor pattern 111 and a second semiconductor pattern 112 provided by patterning the first semiconductor layer 111' and the second semiconductor layer 112'. A partial region of the substrate 101 may also be patterned to form the first fin structure AFa. A device isolation film 105 may be formed on the upper surface region of the substrate 101, positioned around the first fin structure AFa. The device isolation film 105 may partially cover a side surface of the first fin structure AFa, and an upper surface of the device isolation film 105 may be formed to be lower than an upper surface of the first fin structure AFa. For example, the first fin structure AFa on the substrate 101 may protrude upwardly of the device isolation film 105.

Next, referring to FIG. 5C, after removing the first mask pattern M1 and forming an etch stop layer 121 and a dummy gate layer, the dummy gate layer is patterned using a second mask pattern M2 to form a dummy gate pattern DG.

In this process, the etch stop layer 121 is formed almost entirely on the first fin structure AFa and the device isolation film 105, and a dummy gate layer is formed on the etch stop layer 121. Next, the second mask pattern M2 extending in the second direction Y while overlapping a portion of the stack pattern FS is formed on the dummy gate layer, and the dummy gate pattern DG is formed using the second mask pattern M2. In this etching process, the etch stop layer 121 may also be patterned together with the dummy gate layer. For example, the dummy gate layer may be one of polysilicon or amorphous silicon, and the etch stop layer 121 may be silicon nitride or silicon oxynitride.

Next, referring to FIG. 5D, a gate spacer GS may be formed on the sidewall of the dummy gate pattern DG.

In detail, a spacer film covering the dummy gate pattern DG and the stack pattern FS is formed on the substrate 101, and then the spacer film is etchbacked to form a sidewall insulating layer 131 only remaining on the sidewall of the dummy gate pattern. The sidewall insulating layer 131 may include an insulating material, for example, such as silicon nitride ($SiN_a$), silicon oxynitride ($SiO_bN_c$), silicon carbonitride ($SiC_dN_e$), or silicon oxycarbonitride ($SiO_xC_yN_z$). In some embodiments, the sidewall insulating layer 131 may be formed of two or more insulating layers.

Next, referring to FIG. 5E, regions of the stack pattern FS, exposed on both sides of the dummy gate pattern DG and the sidewall insulating layer 131, are removed to form a recess RC, and then, referring to FIG. 5F, the epitaxial layer may be regrown on the surface of the recess RC to form first source/drain regions SD1.

Next, as illustrated in FIG. 5G, an etch stop layer 132, an interlayer insulating layer 135, and an ILD protective layer 170 are formed on the substrate 101. The etch stop layer 132 may be formed on the device isolation film 105, the first source/drain regions SD1, and the dummy gate pattern DG on which the sidewall spacers 131 are formed. The interlayer insulating layer 135 and the ILD protective layer 170 may be sequentially formed to cover the first source/drain regions SD1 and the dummy gate pattern DG. For example, at least one of the etch stop layer 132 and the ILD protective layer 170 may include an insulating material such as silicon nitride ($SiN_a$), silicon oxynitride ($SiO_bN_e$), silicon carbonitride ($SiC_dN_e$), or silicon oxycarbonitride ($SiO_xC_yN_z$) In some embodiments, the ILD protective layer 170 may include silicon nitride, and the interlayer insulating layer 135 may include a low-k material such as silicon oxide.

Next, as illustrated in FIG. 5H, a process of planarizing the ILD protective layer 170 is performed until the dummy gate pattern DG is exposed (refer to line PL' of FIG. 5G), and through the exposed region, the dummy gate pattern DG and a portion of the etch stop layer 132 positioned between the sidewall insulating layers 131 may be removed to prepare a space SG in which the first gate structure (in detail, the gate electrode) is to be formed. In a similar manner, unit cells located in other regions in the plane illustrated in FIG. 1 may be formed together.

FIG. 6 is a plan view illustrating a semiconductor device according to an example embodiment, and FIGS. 7A to 13A and 7B to 13B are cross-sectional views illustrating main processes to describe a method of manufacturing a semiconductor device according to an example embodiment, respectively.

Figure 7A:
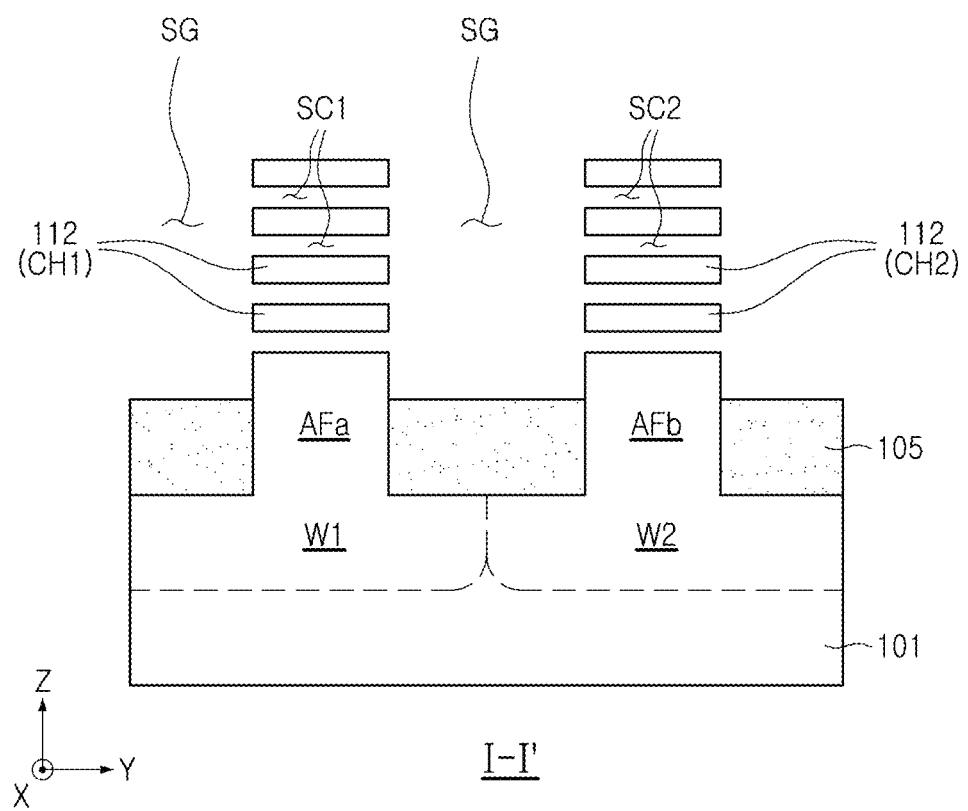
Figure 7B:
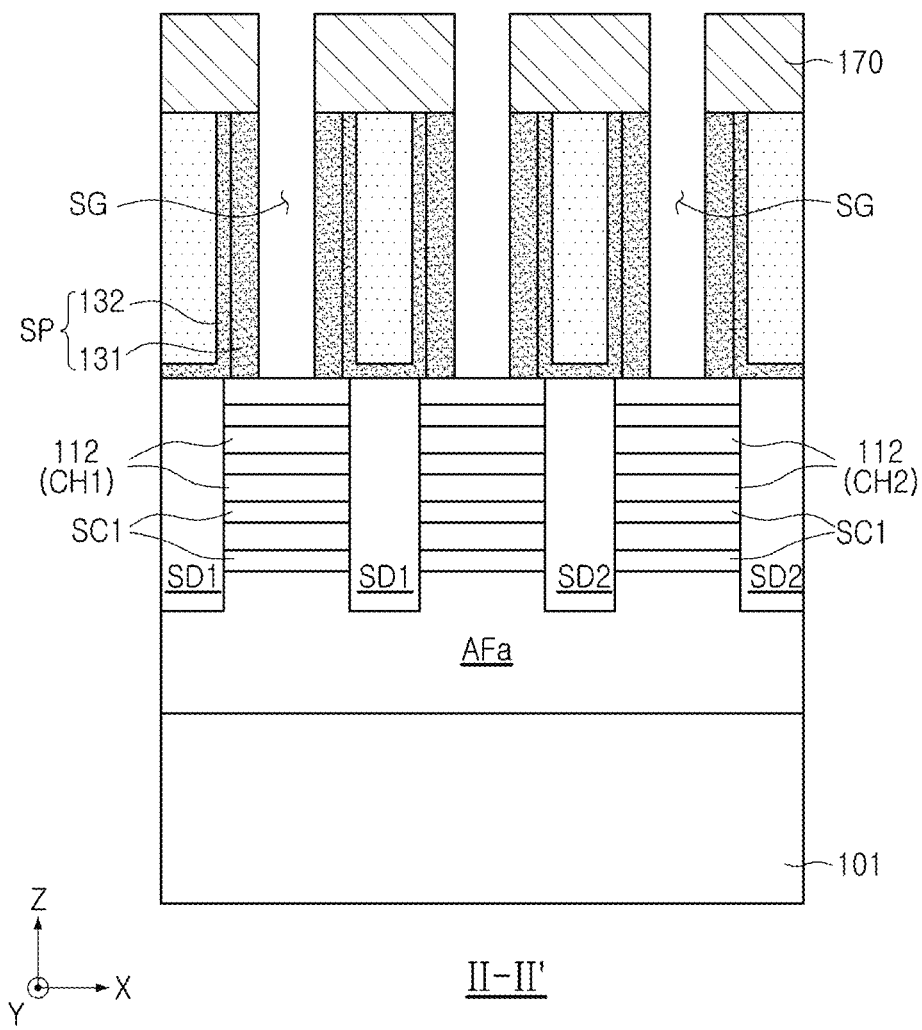

Referring to FIGS. 7A and 7B together with FIG. 6, the cross-sectional structure after the process of removing the dummy gate pattern DG illustrated in FIG. 5H is illustrated, and the method of manufacturing the semiconductor device 100 according to the present embodiment may be understood as an example of the method of manufacturing the semiconductor device illustrated in FIGS. 1 to 3B. In detail, FIGS. 6, 7A, and 7B may correspond to cross-sections (see FIGS. 1, 2A and 3A) of a structure in which the unit cells UC described in the process of FIGS. 5A to 5H are arranged in 3×2, respectively.

In detail, referring to FIGS. 7A and 7B, the gate electrode formation space SG obtained by removing the dummy gate pattern DG may be provided. In the present embodiment, the gate electrode formation space SG is formed of three lines extending in the second direction (e.g., the Y direction). The three lines are arranged with the insulating structures 131, 132, 135 and 170 interposed therebetween in the first direction (e.g., the X direction). The insulating structures 131, 132, 135, and 170 may include gate spacers SP, the interlayer insulating layer 135 positioned therebetween, and the ILD protective layer 170 positioned on the upper surfaces of the gate spacers SP and the interlayer insulating layer 135.

Referring to FIG. 7A, the first semiconductor patterns 111 serving as sacrificial layers are removed on the first fin structure AFa and the second fin structure AFb, such that the second semiconductor patterns 112 may be arranged to be spaced apart from each other in a third direction (e.g., Z-direction). The first semiconductor patterns 111 may be removed by a selective etching process through the gate electrode formation space SG prepared in the previous process. The second semiconductor patterns 112 may be provided as a plurality of first and second channel layers CH1 and CH2, respectively. Spaces SC1 and SC2 of the second semiconductor patterns 112 may be provided as the space in which a gate structure is to be formed, together with the previously secured gate electrode formation space SG. As illustrated in FIG. 7B, the first and second source/drain regions SD1 and SD2 may be covered by the interlayer insulating layer 135 and the ILD protective layer 170.

Figure 8A:
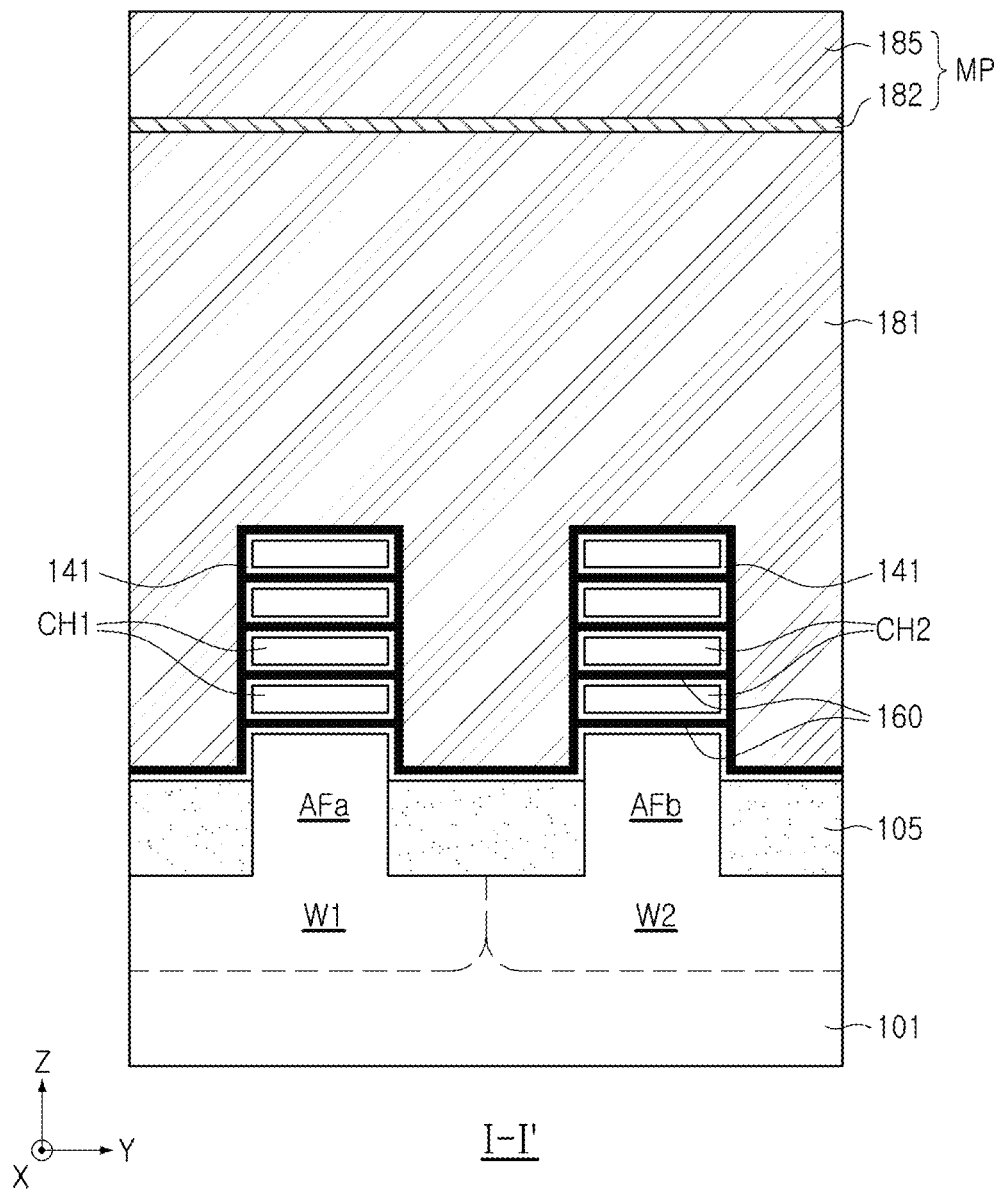
Figure 8B:
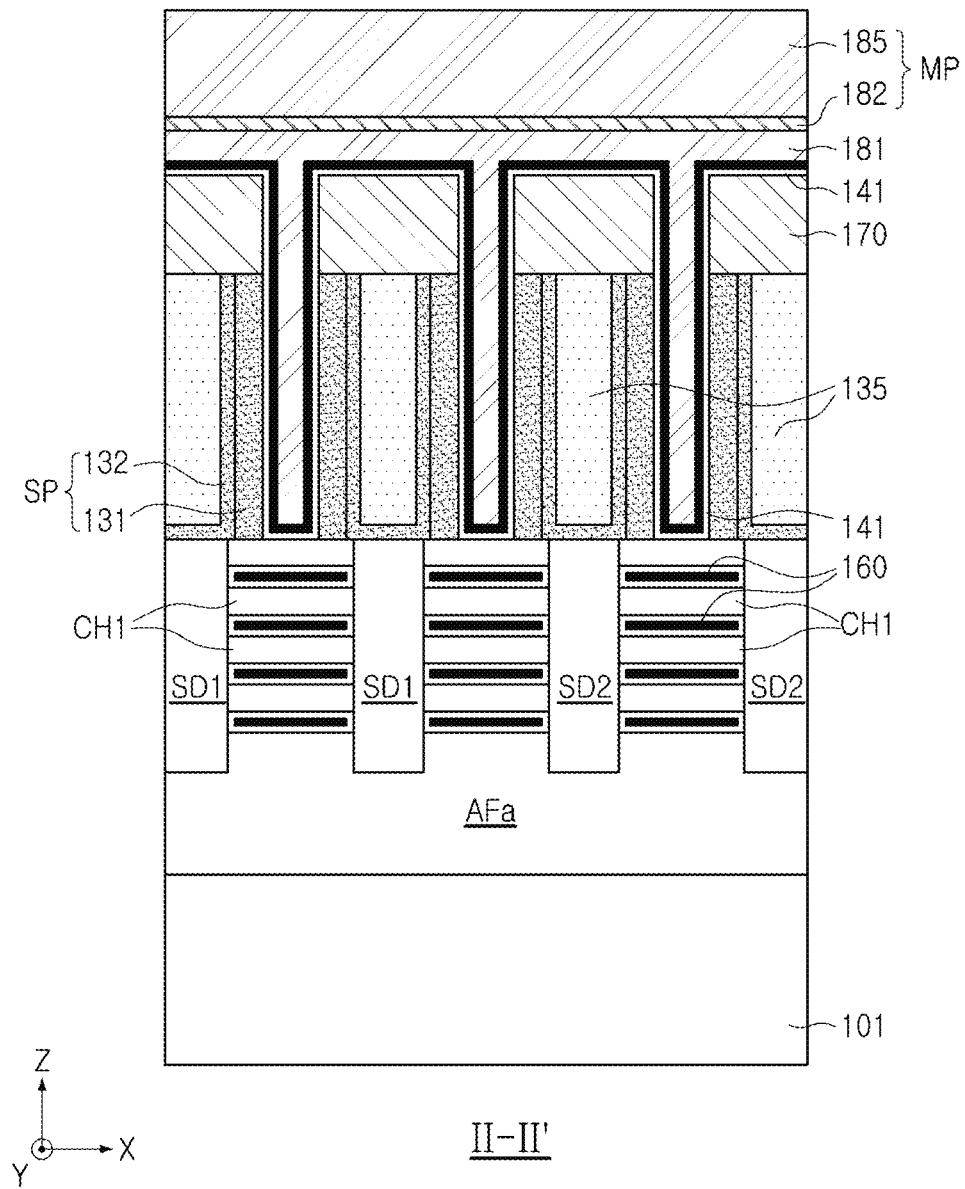

Next, referring to FIGS. 8A and 8B, a gate insulating layer 141 is formed on the entire exposed surface, and subsequently, a protective metal layer 160 is additionally formed, an organic planarization layer 181 is formed, and a photomask layer MP may be formed on the organic planarization layer 181.

The gate insulating layer 141 may be formed to surround the surfaces of the first and second fin structures AFa and AFb, and the first and second channel layers CH1 and CH2. The gate insulating layer 141 may be relatively conformally formed not only on the upper surface of the device isolation film 105, but also on the side surfaces and upper surfaces of the insulating structures 131, 132, 135, and 170. The protective metal layer 160 is formed on the surface of the gate insulating layer 141, and in this embodiment, the protective metal layer 160 may fill spaces SC1 and SC2 between the first and second channel layers CH1 and CH2. The protective metal layer 160 employed in this embodiment may protect the gate insulating layer 141 from damage in a subsequent process. In some embodiments, the process of forming the protective metal layer 160 may be omitted.

The organic planarization layer 181 employed in this embodiment may include an organic material having a relatively high selectivity with respect to the insulating structure (in detail, the ILD protective layer 170). Damage to the insulating structure may be greatly reduced in a subsequent process of forming the field separation layer and the gate isolation pattern. The organic planarization layer 170 may include, for example, a Bottom Anti-Reflective Coating (BARC), a spin-on-hardmask (SOH), or an amorphous carbon layer (ACL).

The photomask layer MP may include an anti-reflection layer 182 and a photoresist 185. For example, the anti-reflection layer 182 may be formed of silicon nitride, silicon oxynitride, amorphous silicon, titanium, titanium dioxide, titanium nitride, chromium oxide, carbon, or combinations thereof. The photomask layer MP is not limited to the two-layer structure and may be changed to various mask structures.

Figure 9A:
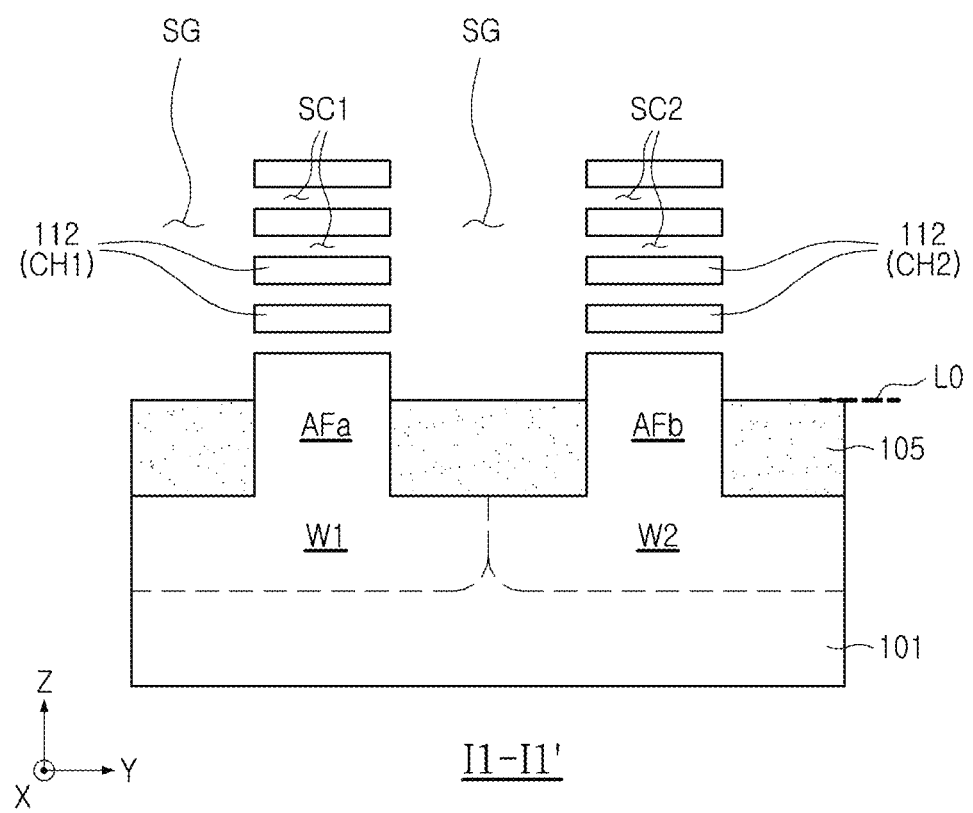
Figure 9B:
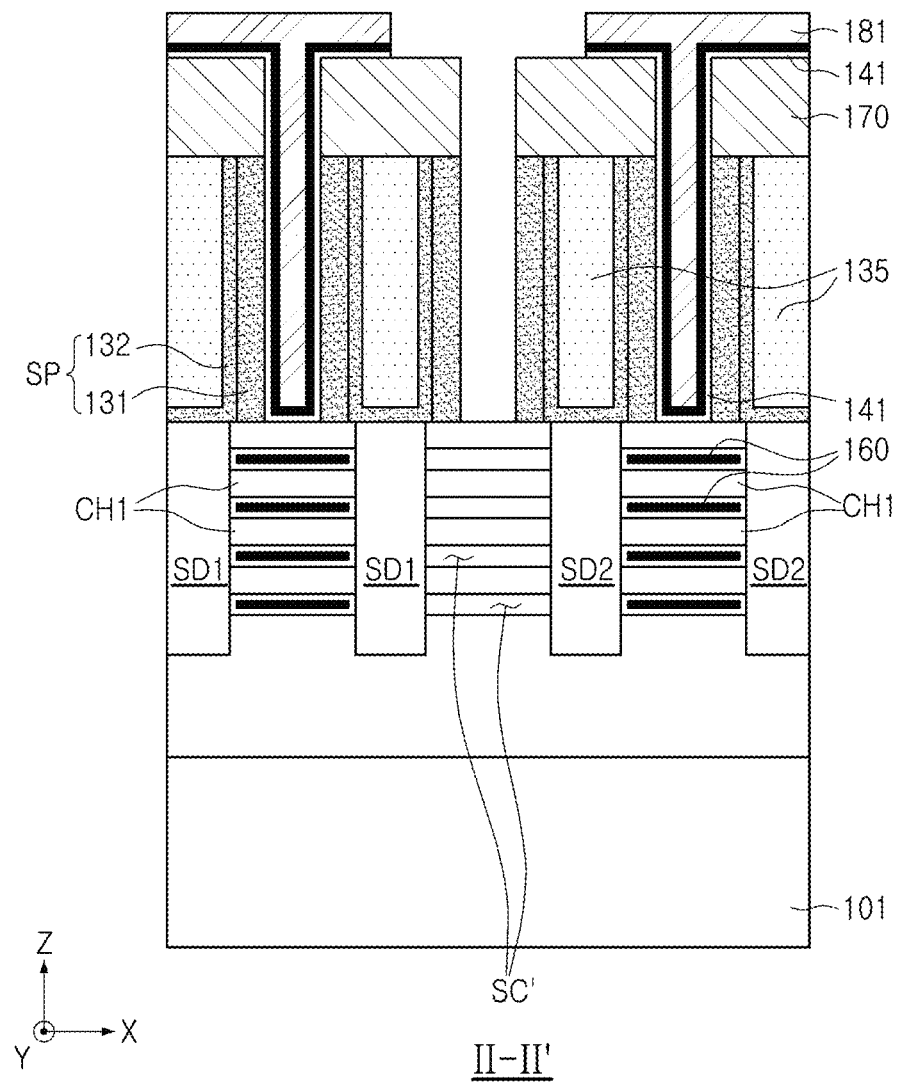

Next, referring to FIGS. 9A and 9B, an organic pattern layer 181P in which a required region is open is formed by patterning the organic planarization layer 181 using the photomask layer MP.

In detail, the organic pattern layer 181P may have a pattern for opening the field separation space (DP of FIG. 6) corresponding to the field separation layer. In the present embodiment, referring to FIG. 6, the field separation space DP may include a connection space CP, and the field separation space DP may be comprised of the spaces SG, SC1, and SC2 illustrated in FIG. 9A. In this process, the organic pattern layer 181P may be patterned such that the gate separation space (see CT of FIG. 6) is also open. The connection spaces CP of the field separation space DP may be arranged to overlap the gate separation space CT in the first direction.

After removing the dummy gate pattern DG and before forming the gate electrode, the organic planarization layer 181 may be patterned to form the field separation space DP and the gate separation space CT. In this patterning process, the photoresist 185 of the photomask layer MP may also be removed. Also, in some embodiments, the organic pattern layer 181P may be formed to expose a region for separating the gate insulating layer 141 into transistor regions (e.g., P-MOS, N-MOS).

Figure 10A:
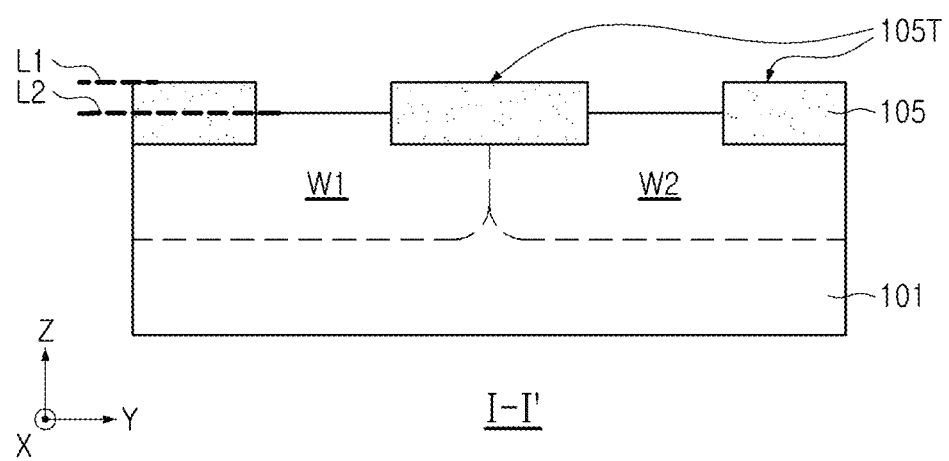
Figure 10B:
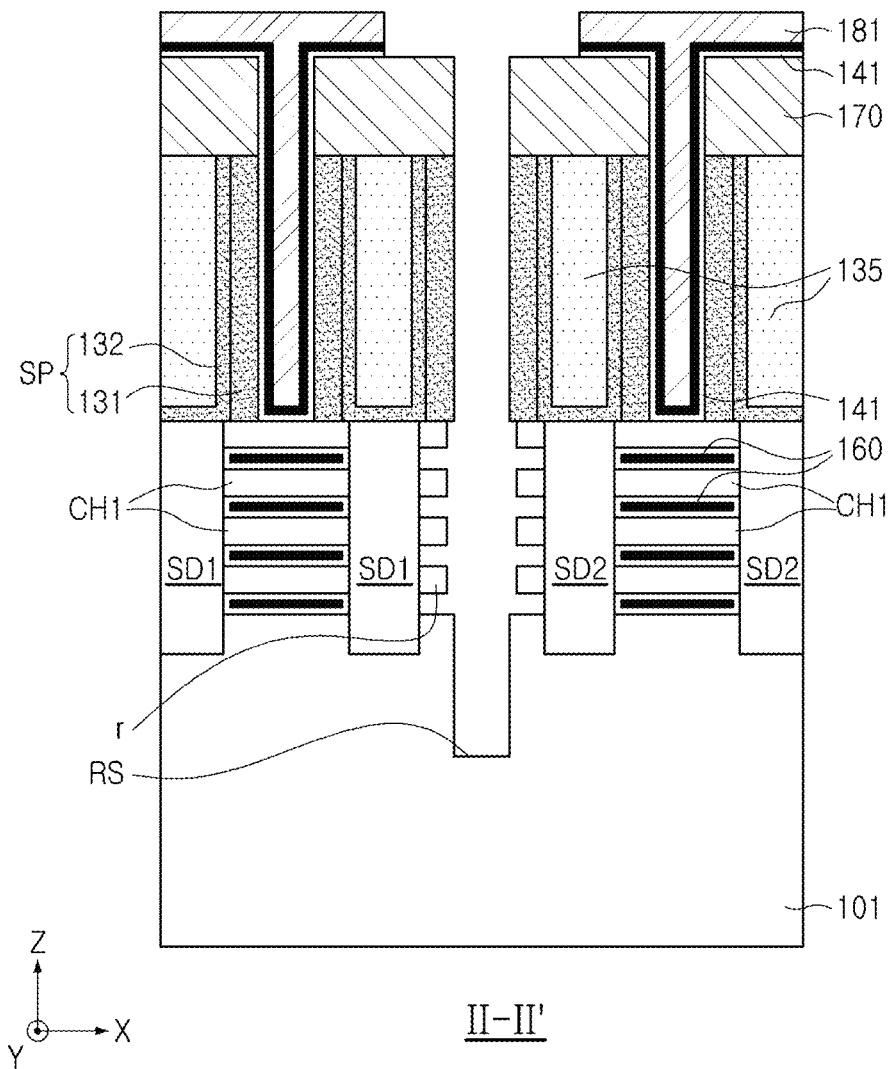

Next, referring to FIGS. 10A and 10B, the plurality of channel layers CH1 and some regions of the first fin structure AFa are removed using the organic pattern layer 181P, to form the first and second active fins AF1 and AF2 from the first fin structure AFa.

The recess RS obtained by the removal in this process may be positioned between the first source/drain region SD1 and the second source/drain region SD2. Although the channel layers CH1 are etched in this process, a partial region r may remain. Also, referring to FIG. 10A, the bottom surface of the recess RS may have a level L2 that is lower than the level L1 of the upper surface of the device isolation film 105. A region of the upper surface 105T of the device isolation film 105, in which the second portion 150b of the field separation layer 150 is located, may have a flat surface. Although not illustrated, the lower surface of the gate separation space (CT of FIG. 6) may also have the same level as the upper surface level L1 of the device isolation film 105 (refer to the lower surface of the gate isolation pattern 155 of FIG. 3B).

Figure 11A:
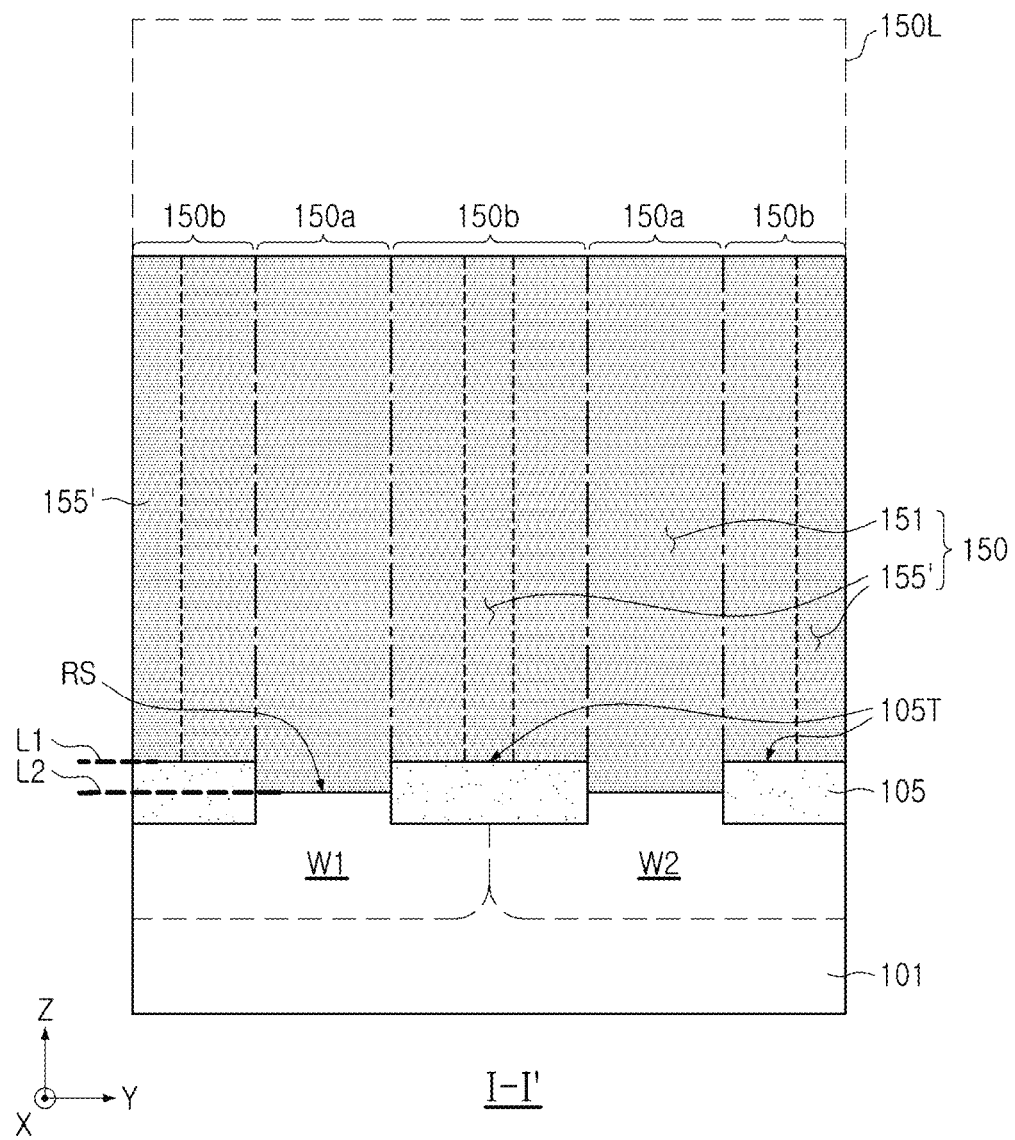
Figure 11B:
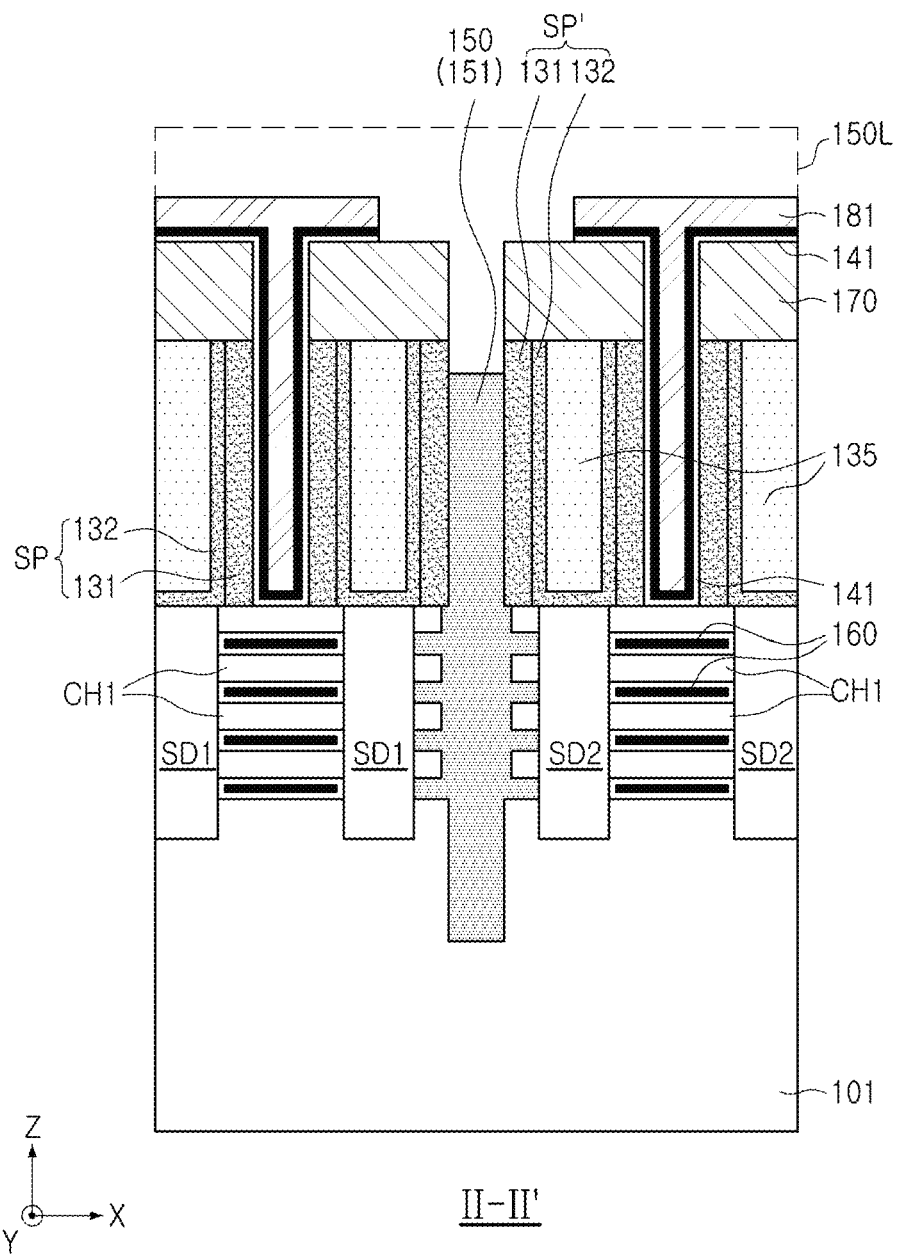

Next, referring to FIGS. 11A and 11B, a required field separation layer 150 may be formed by forming an insulating material layer 150L to fill the field separation space DP and then performing etchbacking.

The gate isolation pattern 155 may be formed in the gate separation space CT together with the field separation layer 150. The gate isolation pattern 155 may include the same material as that of the field separation layer 150. For example, the field separation layer 150 and the gate isolation pattern 155 may include silicon nitride ($SiN_a$), silicon oxynitride ($SiO_bN_c$), silicon carbonitride ($SiC_dN_e$), or silicon oxycarbonitride ($SiO_xC_yN_z$).

The field separation layer 150 may be divided into a diffusion barrier region 151 overlapping adjacent gate structures, and a separation region 155' overlapping the adjacent gate isolation pattern 155 in the second direction. In the present example embodiment, the separation region 155' may be positioned in a region overlapping the gate isolation pattern 155 (see FIGS. 2A and 3B) in the first direction.

In another example, the field separation layer 150 may include a first portion 150a on the recess RS, and a second portion 150b extending from both sides of the first portion 150a in the second direction (e.g., Y direction) to the upper surface 105T of the device isolation film 105. The second portion 150b may include the separation region 155'. As described above, a region of the upper surface 105T of the device isolation film 105, in which the second portion 150b of the field separation layer 150 is located, may have a flat surface.

Figure 12A:
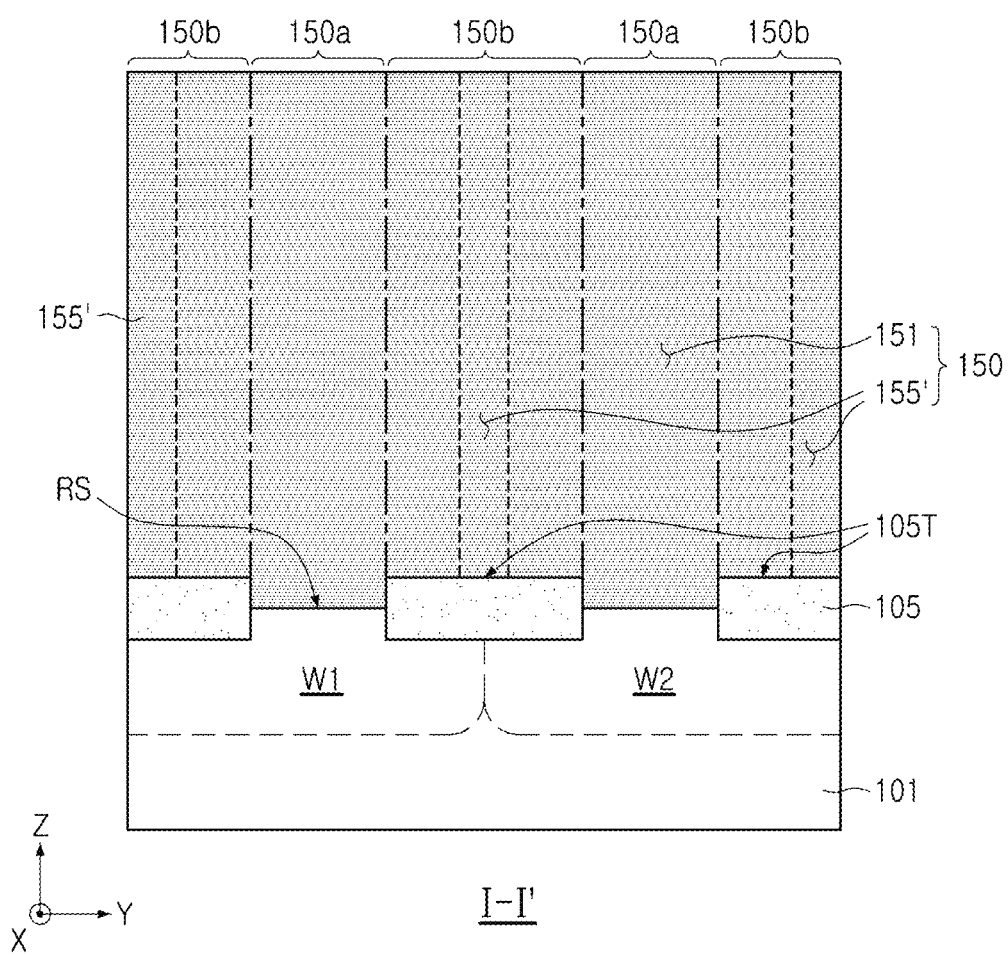
Figure 12B:
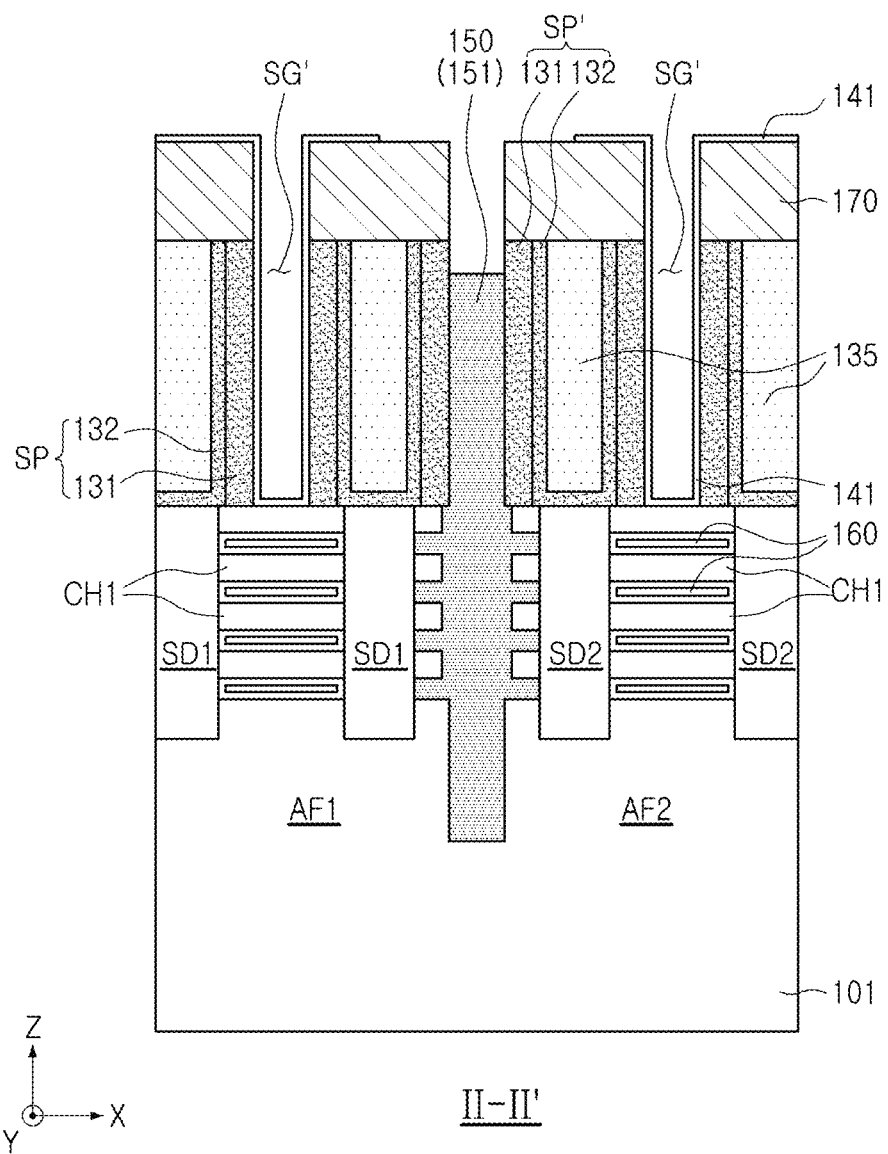

Next, referring to FIGS. 12A and 12B, a space in which the gate electrode is to be formed may be prepared by removing the organic pattern layer 181P.

The removal process of the organic pattern layer 181P may be performed by an ashing/strip process. The space from which the organic pattern layer 181P is removed may serve as a space SG' for the main electrode. In addition, a selective etching process for removing the protective metal layer 160 may be performed. Accordingly, as illustrated in FIG. 12B, an electrode formation space SC' may be additionally secured between the first and second channel layers CH1 and CH2.

Figure 13A:
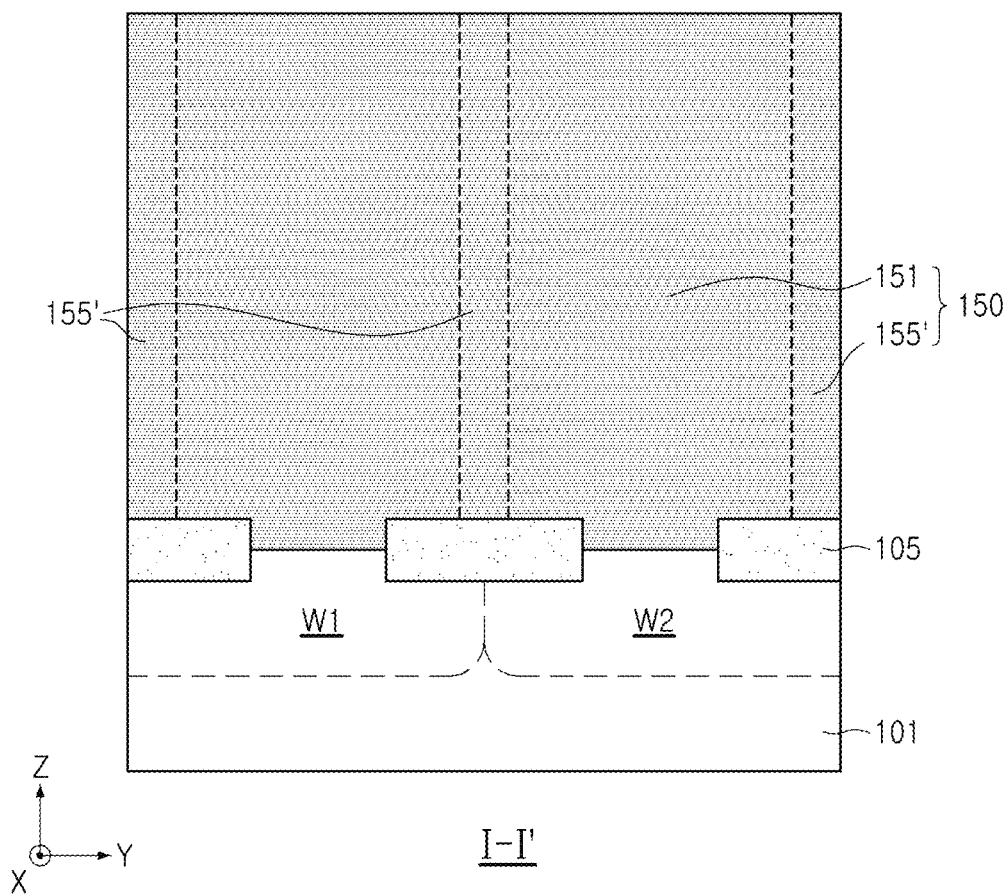
Figure 13B:
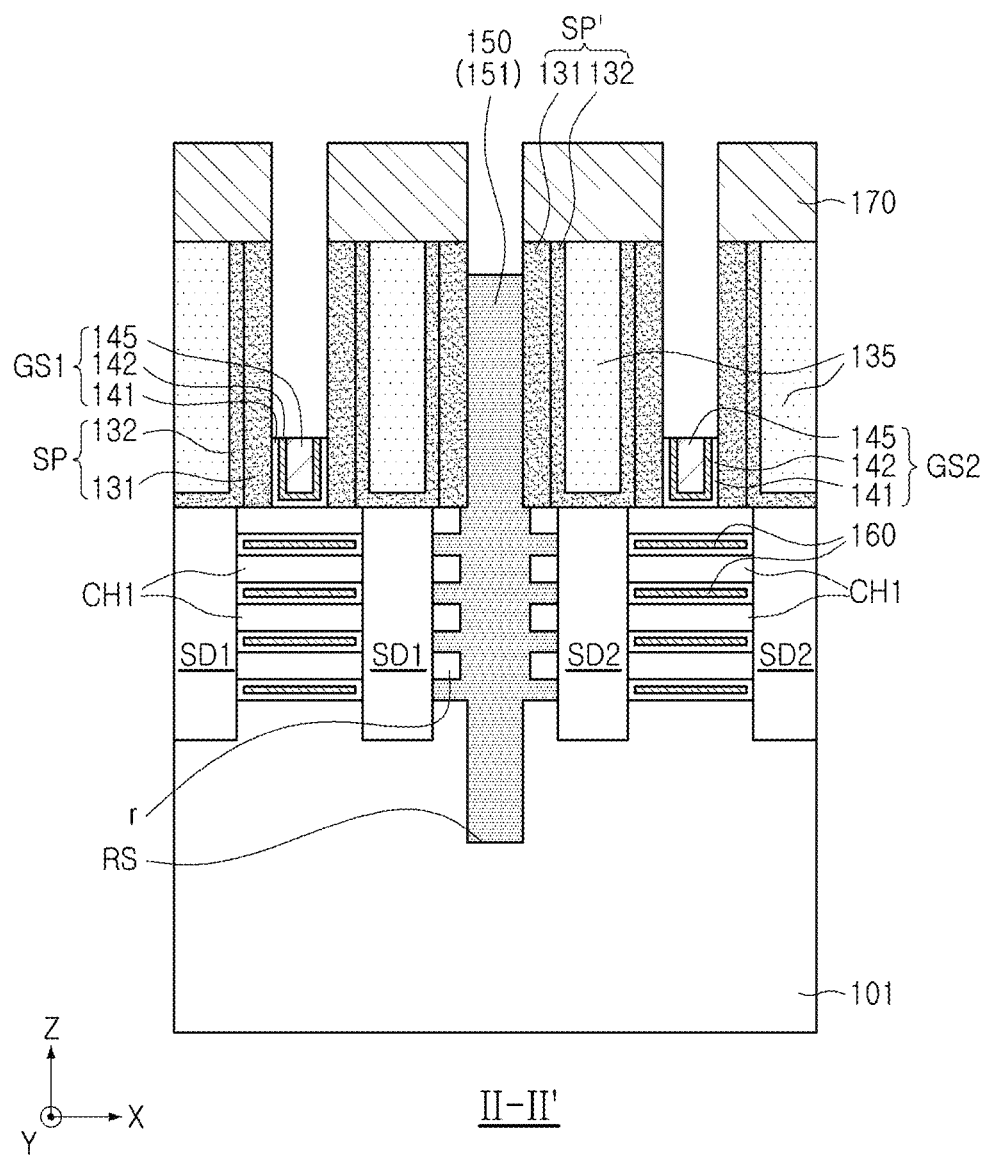

Next, referring to FIGS. 13A and 13B, gate electrode layers 142 and 145 may be formed in gate electrode formation spaces SG and SC', and the second gate electrode layer 145 may be recessed to a required height.

In the present embodiment, the first gate electrode layer 142 may be formed to surround the plurality of first channel layers CH1 only in the gate electrode formation spaces SG' and SC' related to the first channel layer CH1 (e.g., a P-MOS transistor). Additionally, the second gate electrode layer 145 may be formed in the entire gate electrode formation spaces SG' and SC' related to the first and second channel layers CH1 and CH2. The second channel layer CH2 may be surrounded by the second gate electrode layer 145 (e.g., an N-MOS transistor). Additionally, after a planarization process is performed on the second gate electrode layer 145 until the ILD protective layer 170 is exposed, the second gate electrode layer 145 may be recessed to a required height.

Next, an etching process may be performed on the ILD protective layer 170 and the spacers SP and SF. Next, the semiconductor device illustrated in FIGS. 1, 2A to 2C, 3A and 3B may be formed by forming the gate capping layer (180 of FIG. 2A).

As described above, since the gate isolation pattern 155 and the separation region 155' are not formed in advance before the formation of the field separation layer 150, the shadowing effect caused by the separation region 155' during the formation of the field separation layer may be eliminated. On the other hand, since the interlayer insulating layer 135 is protected by the ILD protective layer 170 (e.g., SiN) during the formation of the field separation layer 150, loss of the interlayer insulating layer 135 may be effectively prevented even in a scaled condition.

Figure 14A:
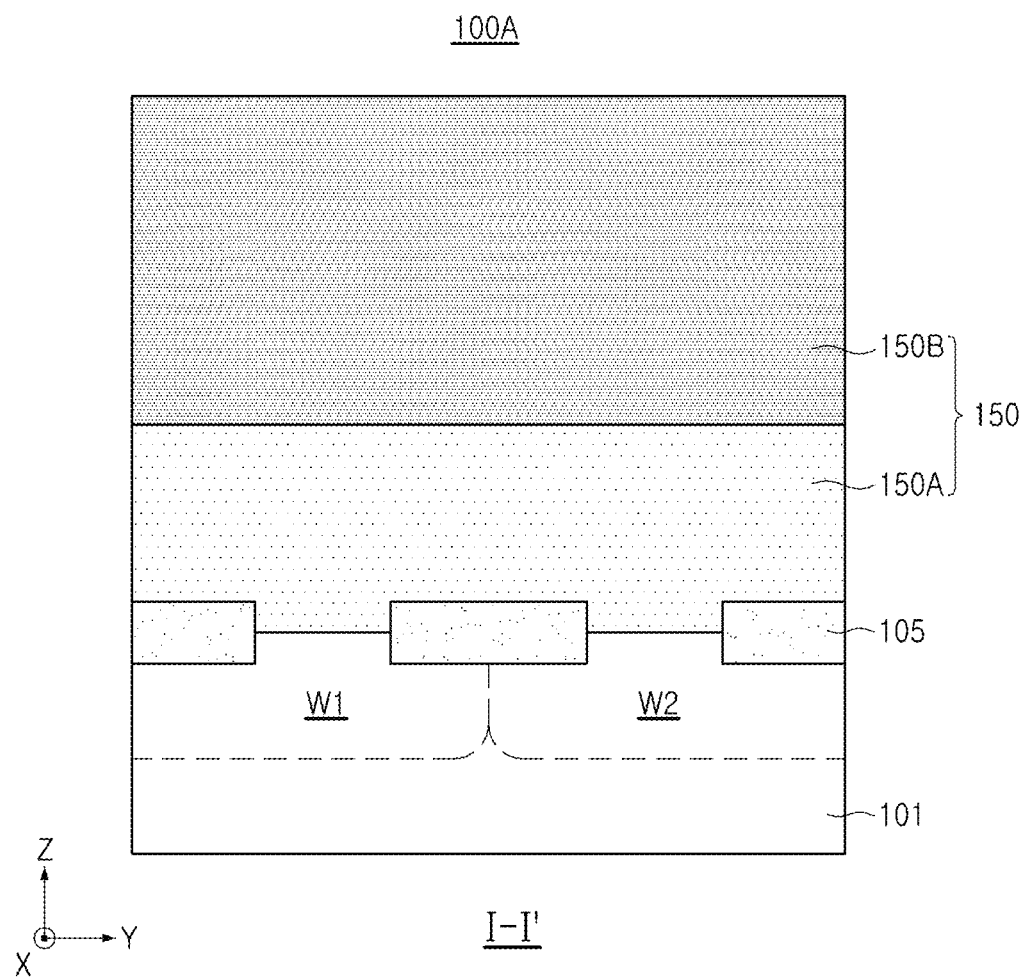
FIGS. 14A and 14B are cross-sectional views each illustrating a semiconductor device according to an example embodiment.
Figure 14B:
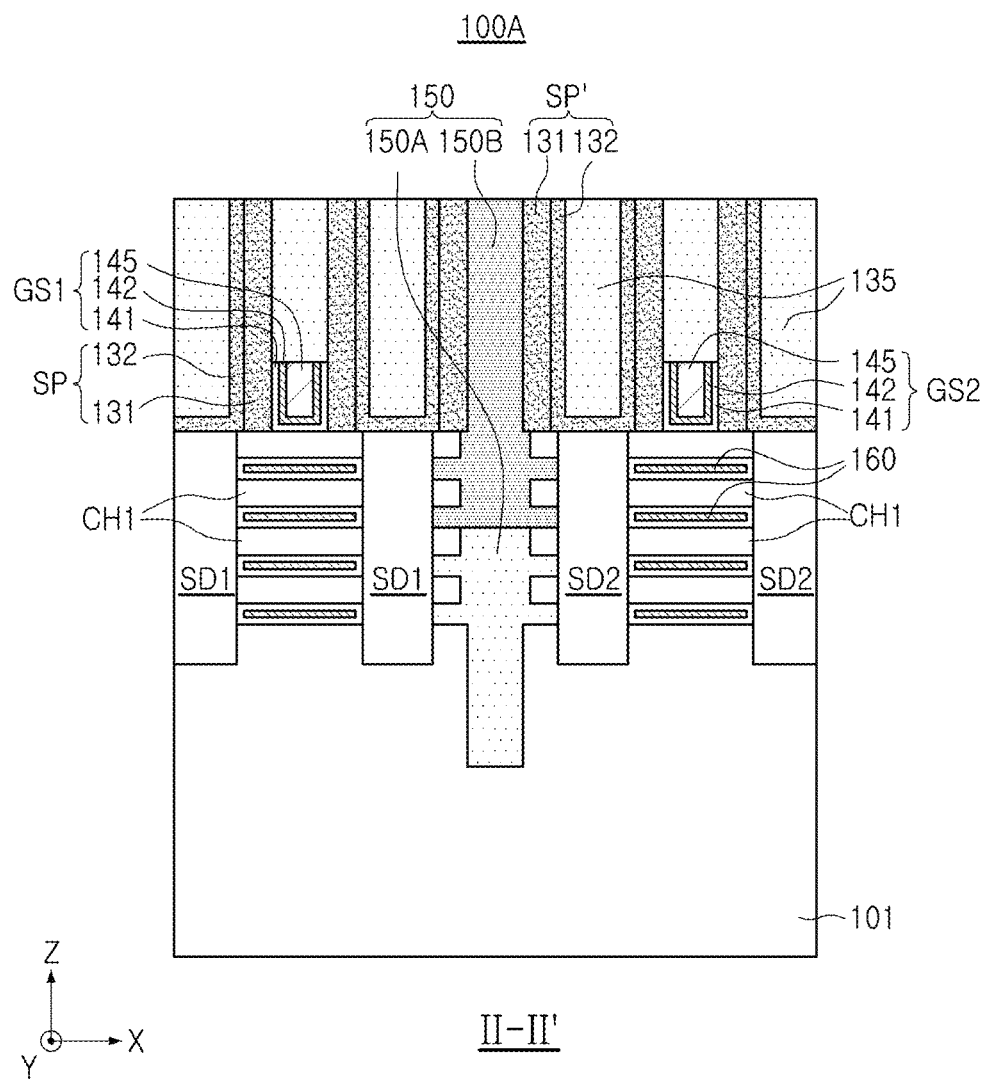

FIGS. 14A and 14B are cross-sectional views each illustrating a semiconductor device according to an example embodiment.

Referring to FIGS. 14A and 14B, a semiconductor device 100A according to an example embodiment may be understood to be similar to the semiconductor device 100 illustrated in FIGS. 1, 2A to 2C, 3A and 3B, except that the field separation layer 150' includes different material layers 150A and 150B. In addition, the components of this embodiment refer to the same or similar components of the semiconductor device 100 illustrated in FIGS. 1, 2A to 2C, 3A and 3B unless otherwise specified.

The field separation layer 150' may include a lower region 150A including a first insulating material, and an upper region 150B including a second insulating material different from the first insulating material. As described above, by designing different materials for the upper and lower regions of the field separation layer, which may be used as a stress relief structure for the semiconductor device 100A. For example, the first insulating material may include silicon oxide ($SiO_x$), and the second insulating material may include silicon nitride ($SiN_a$), silicon oxynitride ($SiO_bN_c$), silicon carbonitride ($SiC_dN_e$), or silicon oxide carbonitride ($SiO_xC_yN_z$) Conversely, in some embodiments, the first and second insulating materials may be selected or a different material may be selected.

Figure 15A:
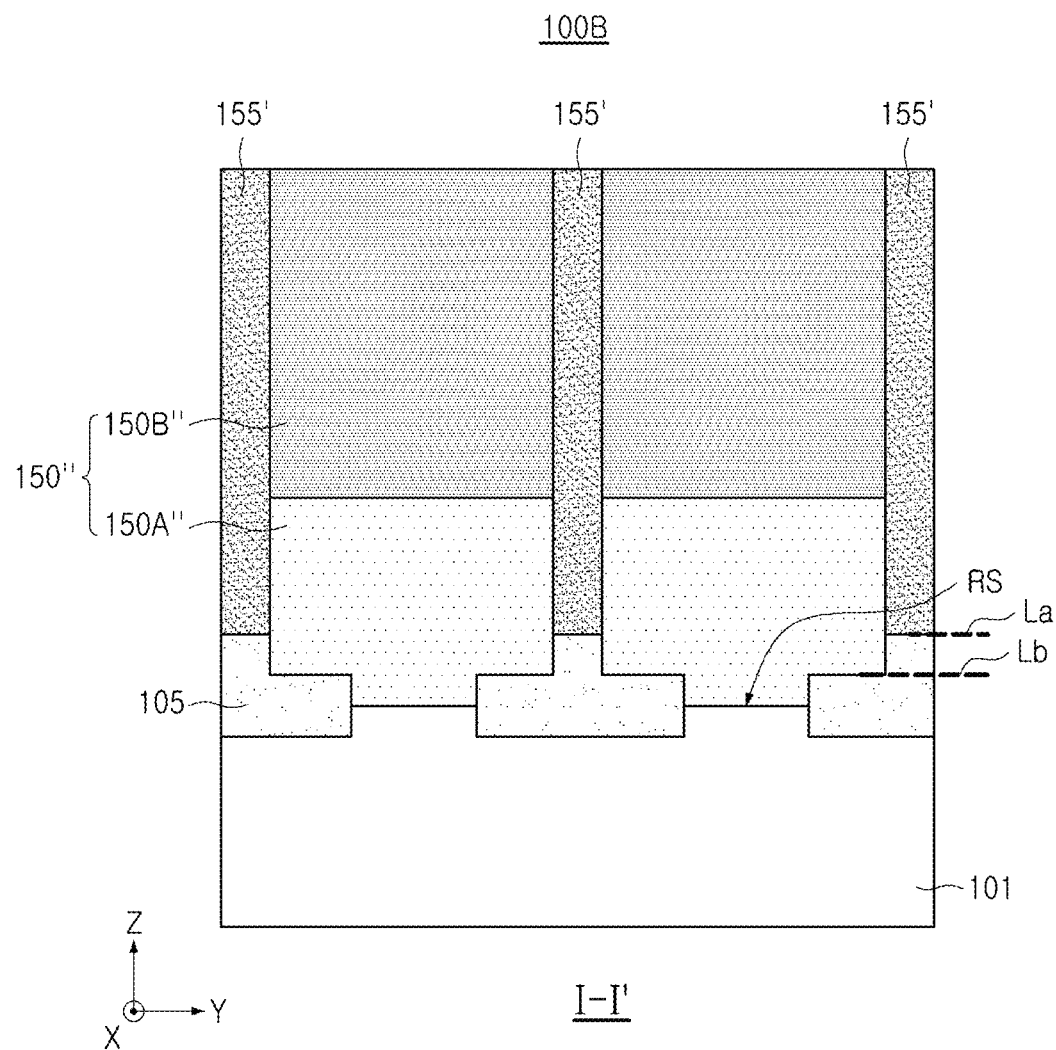
FIGS. 15A and 15B are cross-sectional views each illustrating a semiconductor device according to an example embodiment.
Figure 15B:
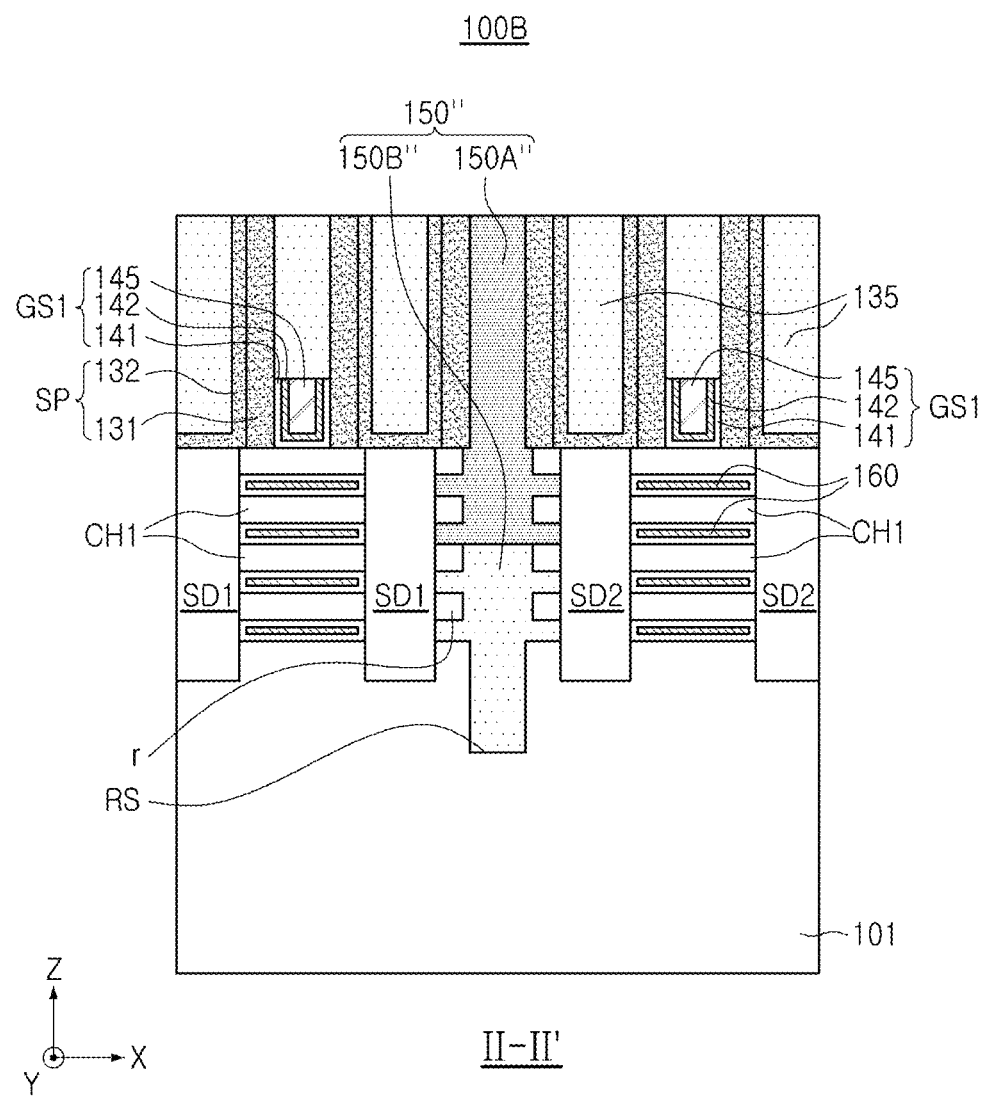

FIGS. 15A and 15B are cross-sectional views each illustrating a semiconductor device according to an example embodiment.

Referring to FIGS. 15A and 15B, a semiconductor device 100B according to an example embodiment may be understood to be similar to the semiconductor device 100 illustrated in FIGS. 1, 2A to 2C, 3A and 3B, except that a field separation layer 150" includes different material layers and the field separation layer 150" is formed after first forming a gate isolation pattern 155'. Unless otherwise specifically described, the same components as or similar to those of the semiconductor device 100 illustrated in FIGS. 1, 2A to 2C, 3A and 3B may be understood with reference to the descriptions thereof above.

The field separation layer 150" has a lower region 150A" including a first insulating material and an upper region 150B" including a second insulating material different from the first insulating material, similarly to the form illustrated in FIGS. 14A and 14B. In this embodiment, a gate isolation pattern 155" may be formed in advance before the field separation layer 150" is formed. When the gate isolation pattern 155" is formed first, an exposed portion of the device isolation film 105 may be etched in the process of forming the recess RS for separating the fin structure. A level Lb of the exposed portion of the device isolation film 105 may be lower than a level La of the region in which the gate isolation pattern 155' is located.

In the previous embodiments, only the form in which the structure such as the gate isolation pattern is applied to the gate-all-around type field effect transistor is illustrated, but except for the configuration related to the plurality of channel layers, the same may be applied to the transistor having a general three-dimensional fin structure. Such an embodiment is illustrated in FIGS. 16, 17A to 17C, 18A and 18B.

Figure 16:
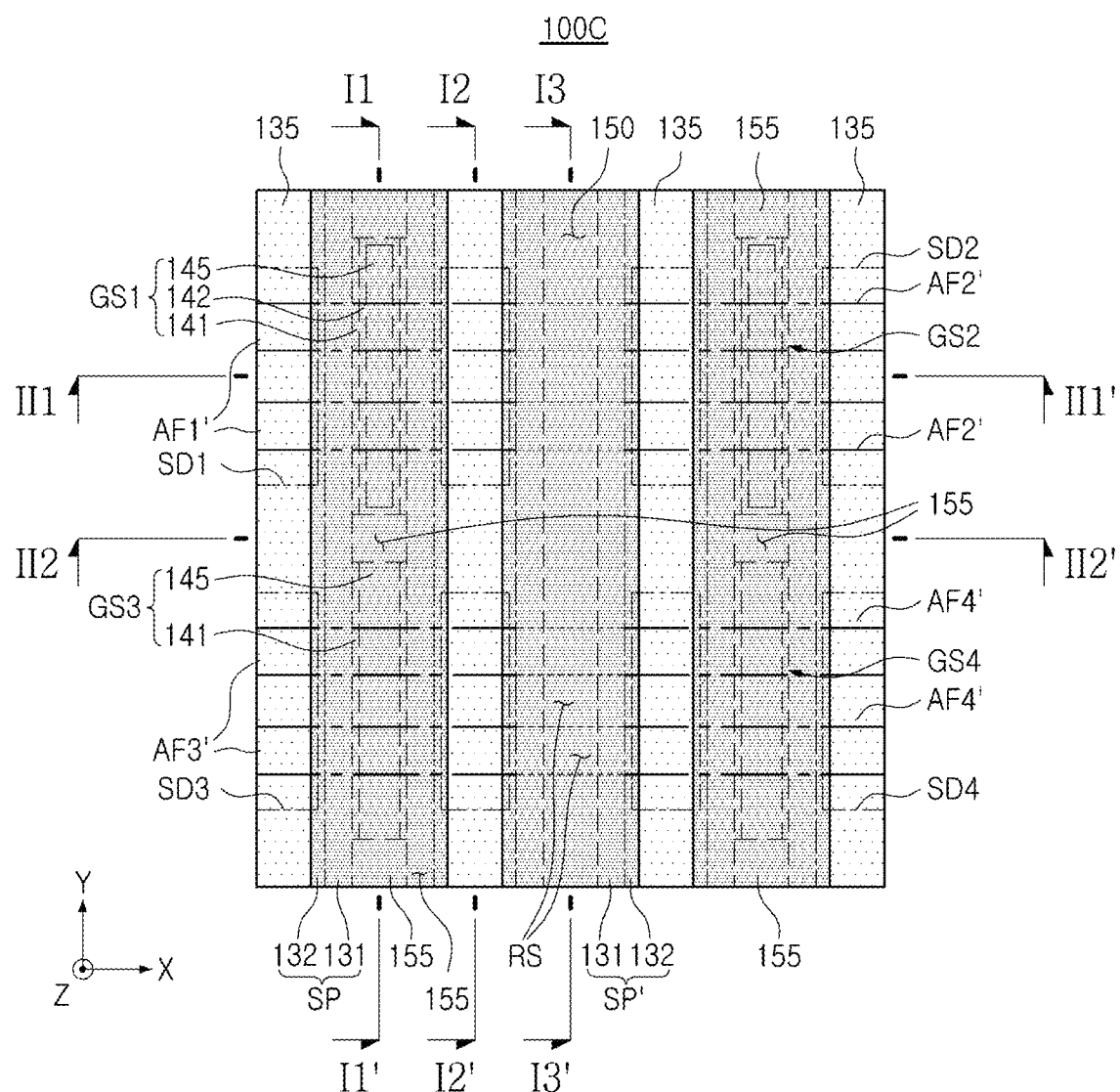
FIG. 16 is a plan view illustrating a semiconductor device according to an example embodiment.
Figure 17A:
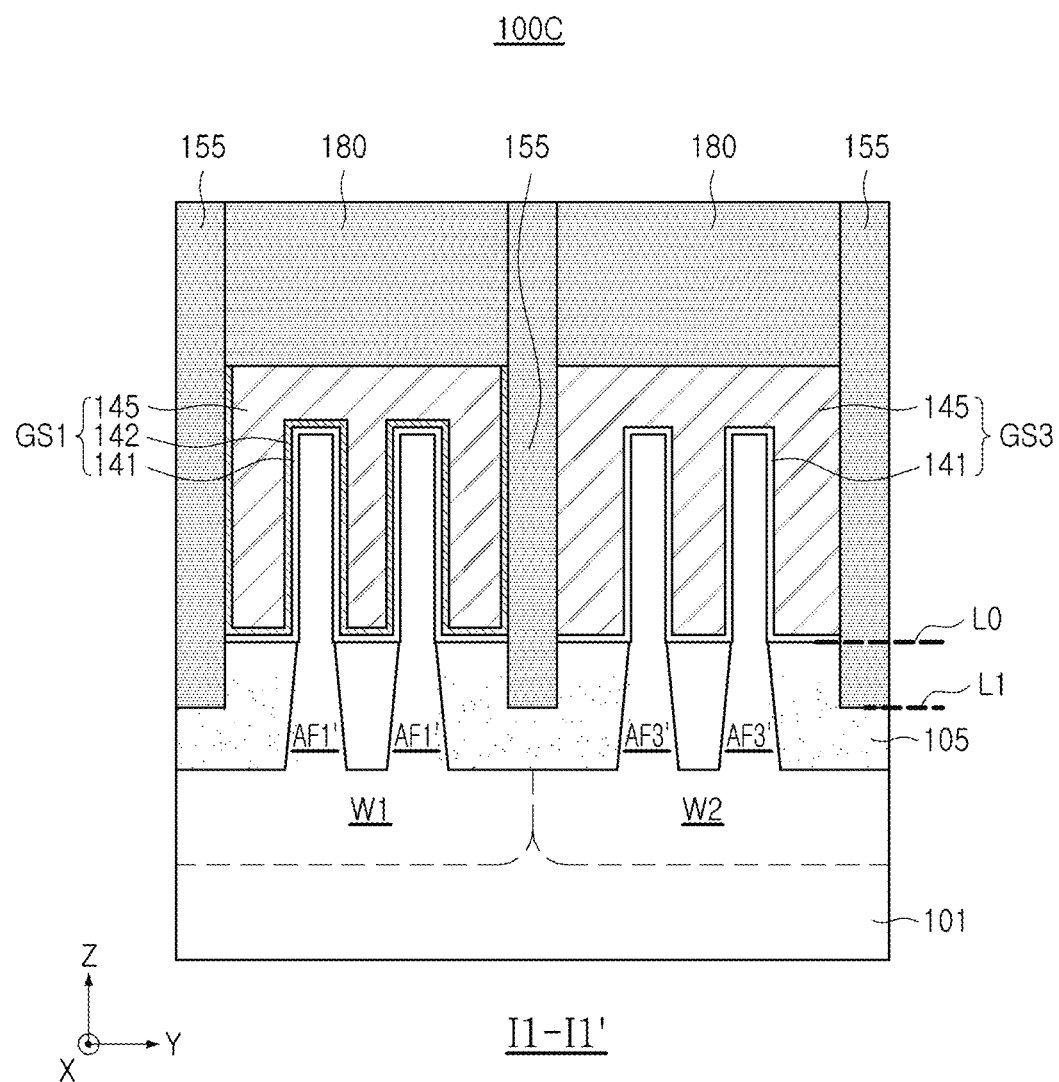
FIGS. 17A to 17C are cross-sectional views of the semiconductor device illustrated in FIG. 16, taken along lines I1-I1', I2-I2', and I3-I3', respectively.
Figure 17B:
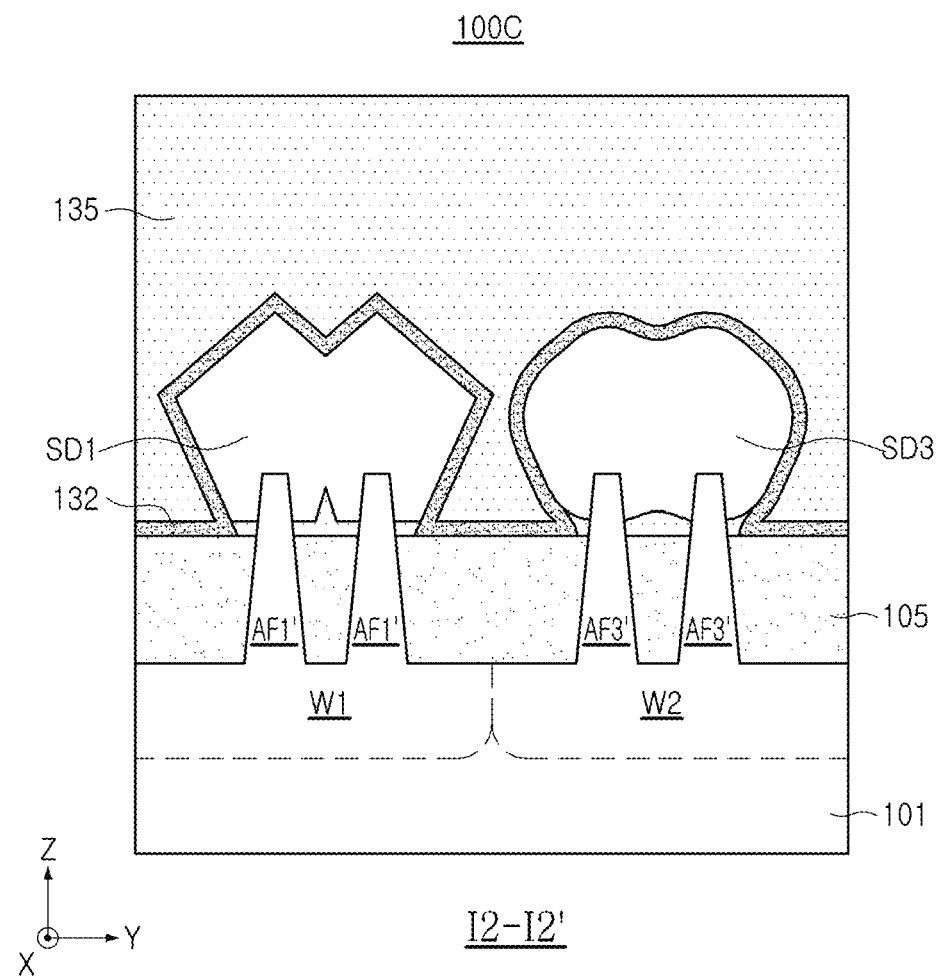
Figure 17C:
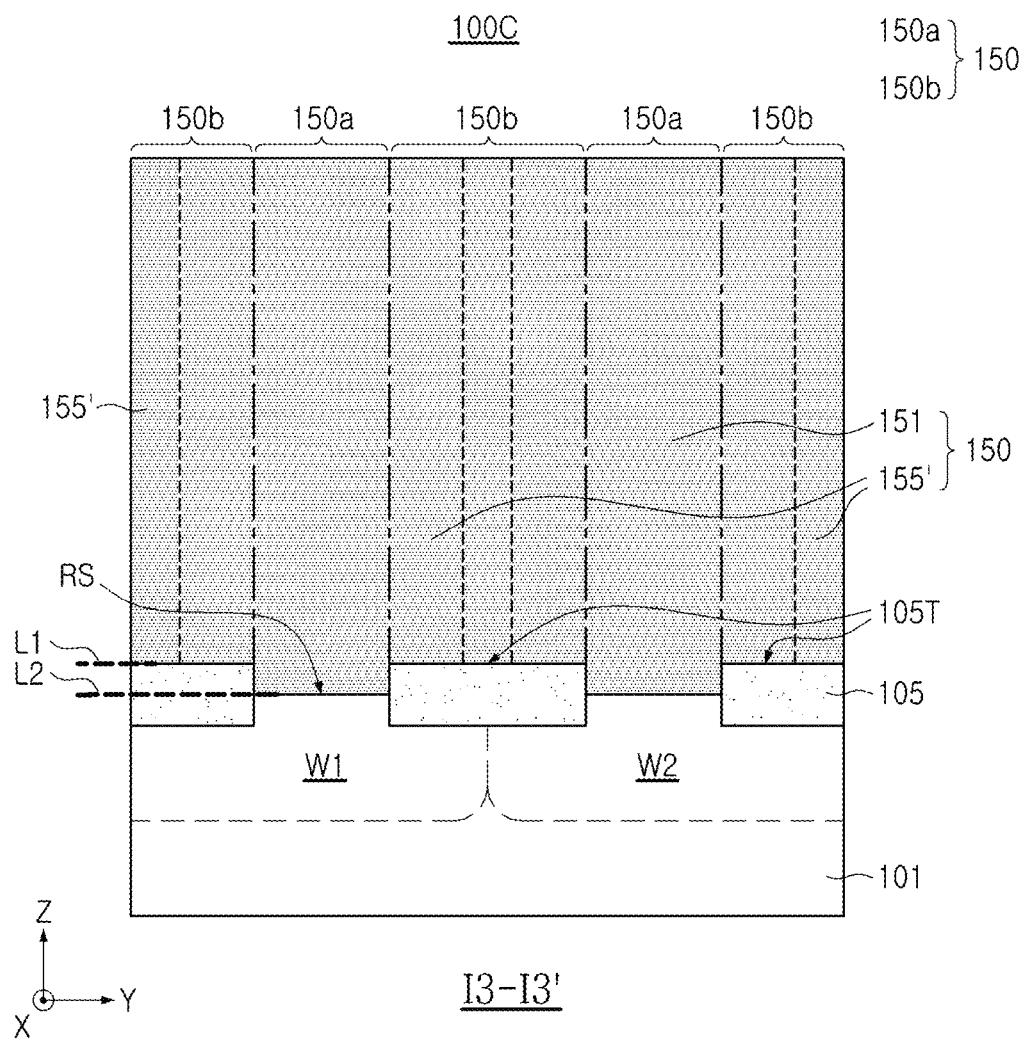
Figure 18A:
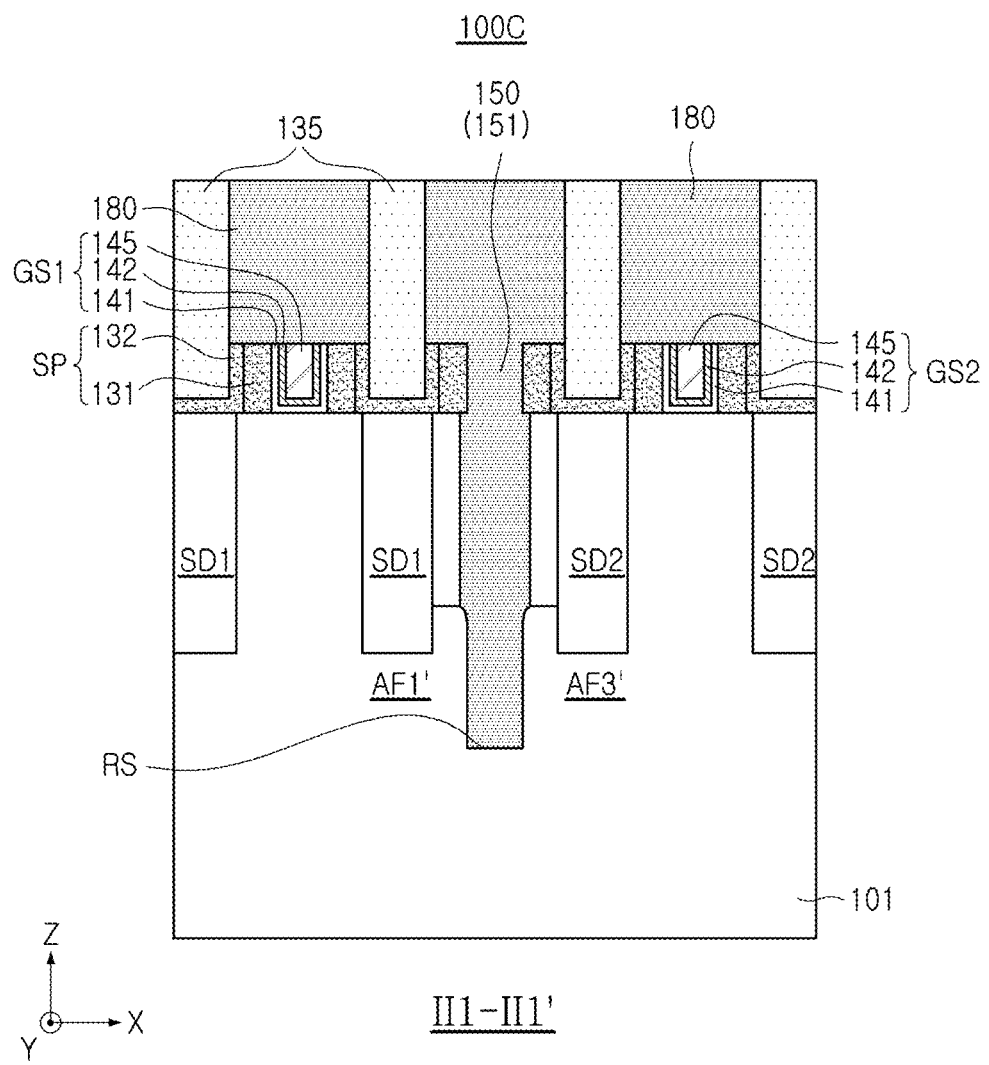
FIGS. 18A and 18B are cross-sectional views of the semiconductor device illustrated in FIG. 16, taken along lines II1-II1' and II2-II2', respectively.
Figure 18B:
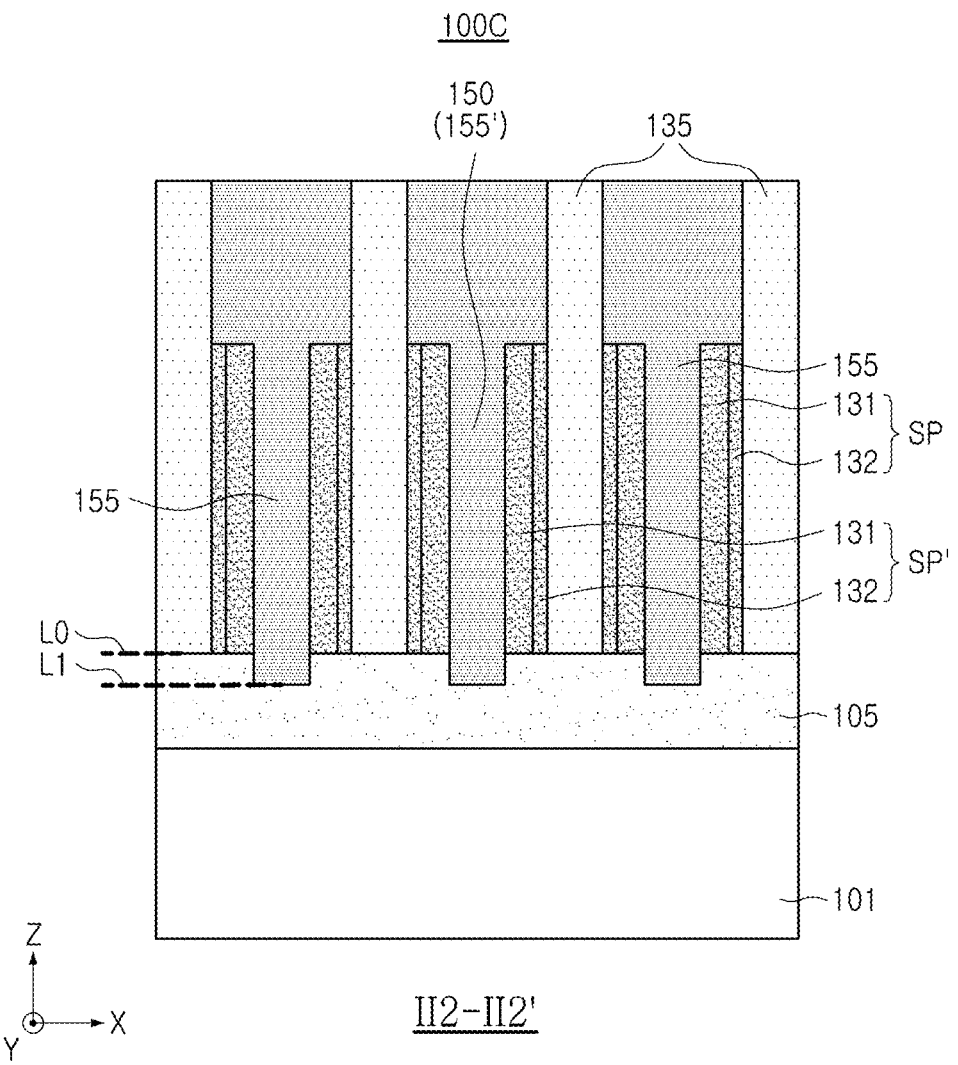

FIG. 16 is a plan view illustrating a semiconductor device according to an example embodiment. FIGS. 17A to 17C are respectively cross-sectional views of the semiconductor device illustrated in FIG. 16, taken along lines I2-I2', and I3-I3', respectively. FIGS. 18A and 18B are cross-sectional views of the semiconductor device illustrated in FIG. 16, taken along lines II1-II1' and II2-II2', respectively.

Referring to FIGS. 17A to 17C and 18A and 18B together with FIG. 16, a semiconductor device 100C according to an example embodiment may be understood to be similar to the semiconductor device 100 illustrated in FIGS. 1, 2A to 2C, 3A and 3B, except for using a plurality of active fins AF1' and AF2' having a three-dimensional structure, instead of a plurality of channel layers, as a channel region. In addition, the components of this embodiment may refer to the descriptions of the same or similar components of the semiconductor device 100 illustrated in FIGS. 1, 2A to 2C, 3A and 3B, unless otherwise specified.

As illustrated in FIGS. 16, 17A and 17B, the semiconductor device 100C according to the present embodiment has a structure in which a plurality of first to fourth active fins AF1' to AF4' having a three-dimensional structure, protruding upwardly of a device isolation film 105 are used as channel regions, without introducing a plurality of channel layers. In the present embodiment, a first active region W1 may include two first active fins AF1' and two second active fins AF2' arranged on the same line, respectively, and a second active region W2 may include two third active fins AF3' and two second active fins AF2' arranged on the same line, respectively. As illustrated in FIG. 17B, epitaxial layers grown from recessed regions of the two first and third active fins AF1' and AF3', respectively, are merged with each other to provide respectively one first and third source/drain regions SD1 and SD3. Similarly, epitaxial layers grown from recessed regions of the two second and fourth active fins AF2' and AF4', respectively, are merged with each other to provide respectively one second and fourth source/drain regions SD2 and SD4.

The field separation layer 150 employed in this embodiment may be between the first and second active fins AF1' and AF2' and between the third and fourth active fins AF3' and AF4', similarly to that in the previous embodiment. The field separation layer 150 employed in the present embodiment may include a first portion 150a that is positioned between the adjacent active fins AF1' and AF2' or AF3' and AF4' and in the recess RS; and a second portion 150b extending from both sides of the first portion 150a in the second direction (e.g., the Y direction) to the upper surface 105T of the device isolation film 105. Also, a region of the upper surface 105T of the device isolation film 105, in which the second portion 150b of the field separation layer 150 is located, may have a flat surface. Also, the bottom surface of the recess RS may have a level L2 lower than an upper surface L1 of the device isolation film 105.

A width of the field separation layer 150 in the first direction (e.g., X direction) may be greater than a width of each of the first and third gate structures GS1 and GS3 in the first direction. The field separation layer 150 may be divided into a diffusion barrier region 151 overlapping adjacent gate structures, and a separation region 155' overlapping the adjacent gate isolation pattern 155 in the second direction. The field separation layer 150 may be formed together with the gate isolation pattern 155. The lower surface of the gate isolation pattern 155 may have a lower surface at the same level L1 as the lower surface of the second portion 150b of the field separation layer 150 (refer to FIGS. 17A, 17C and 18B). The gate isolation pattern 155 may include the same material as that of the field separation layer 150. For example, the field separation layer 150 and the gate isolation pattern 155 may include silicon nitride ($SiN_a$), silicon oxynitride ($SiO_bN_c$), silicon carbonitride ($SiC_dN_e$), or silicon oxycarbonitride ($SiO_xC_yN_z$).

Various features of the foregoing embodiments may be combined with each other to be implemented in various forms, and all of the above-described various features and combinations thereof may also be advantageously applied to the semiconductor device 100C according to the present embodiment.

Figure 19:
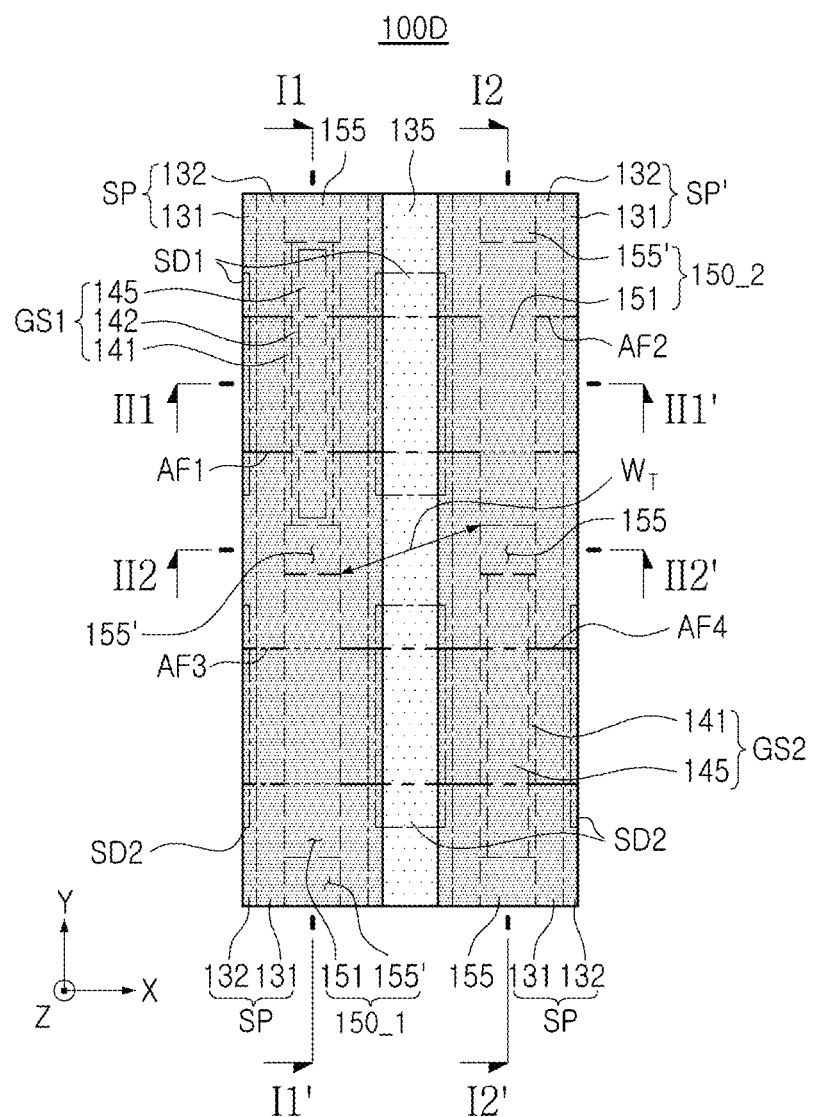
FIG. 19 is a plan view illustrating a semiconductor device according to an example embodiment.
Figure 20A:
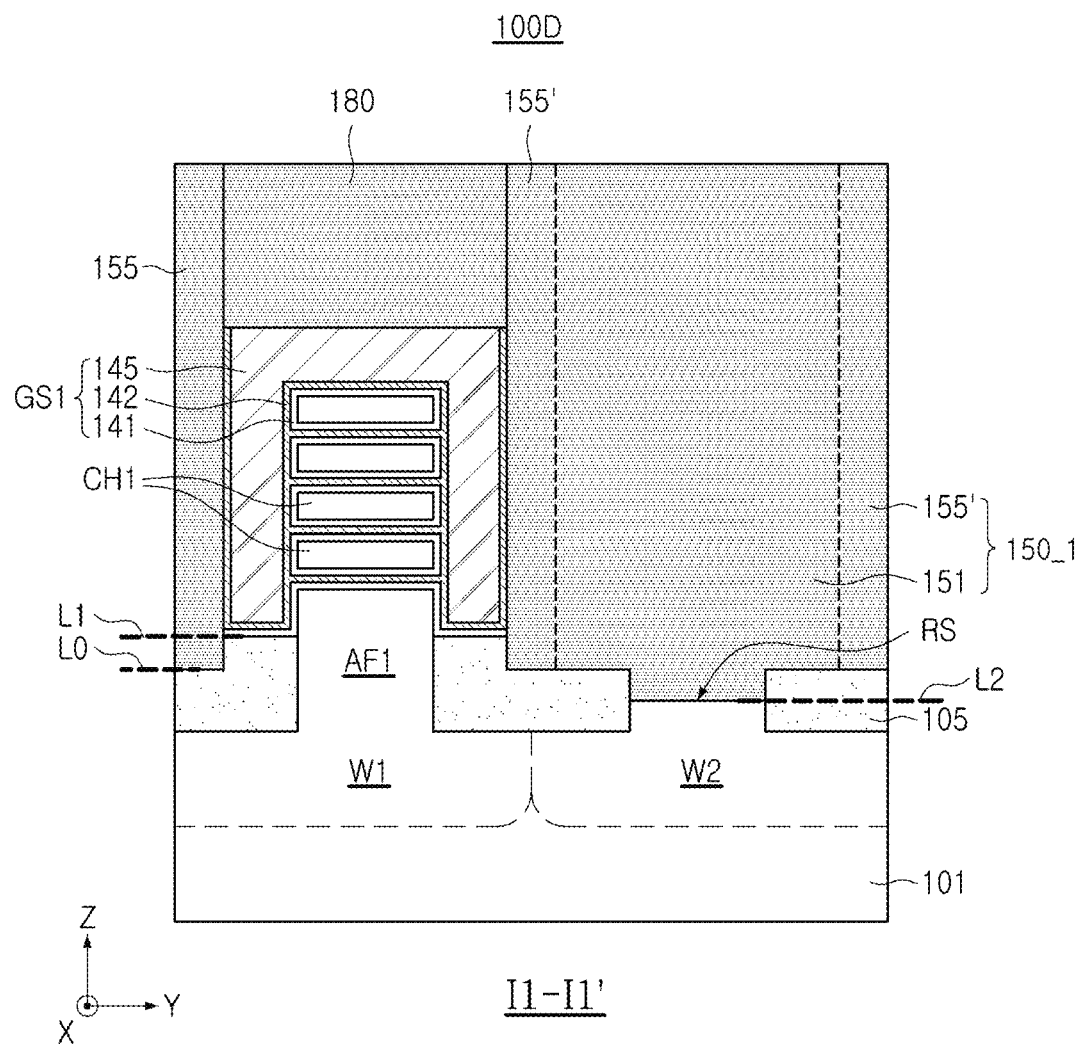
FIGS. 20A and 20B are cross-sectional views of the semiconductor device illustrated in FIG. 19, taken along lines I1-I1' and I2-I2', respectively.
Figure 20B:
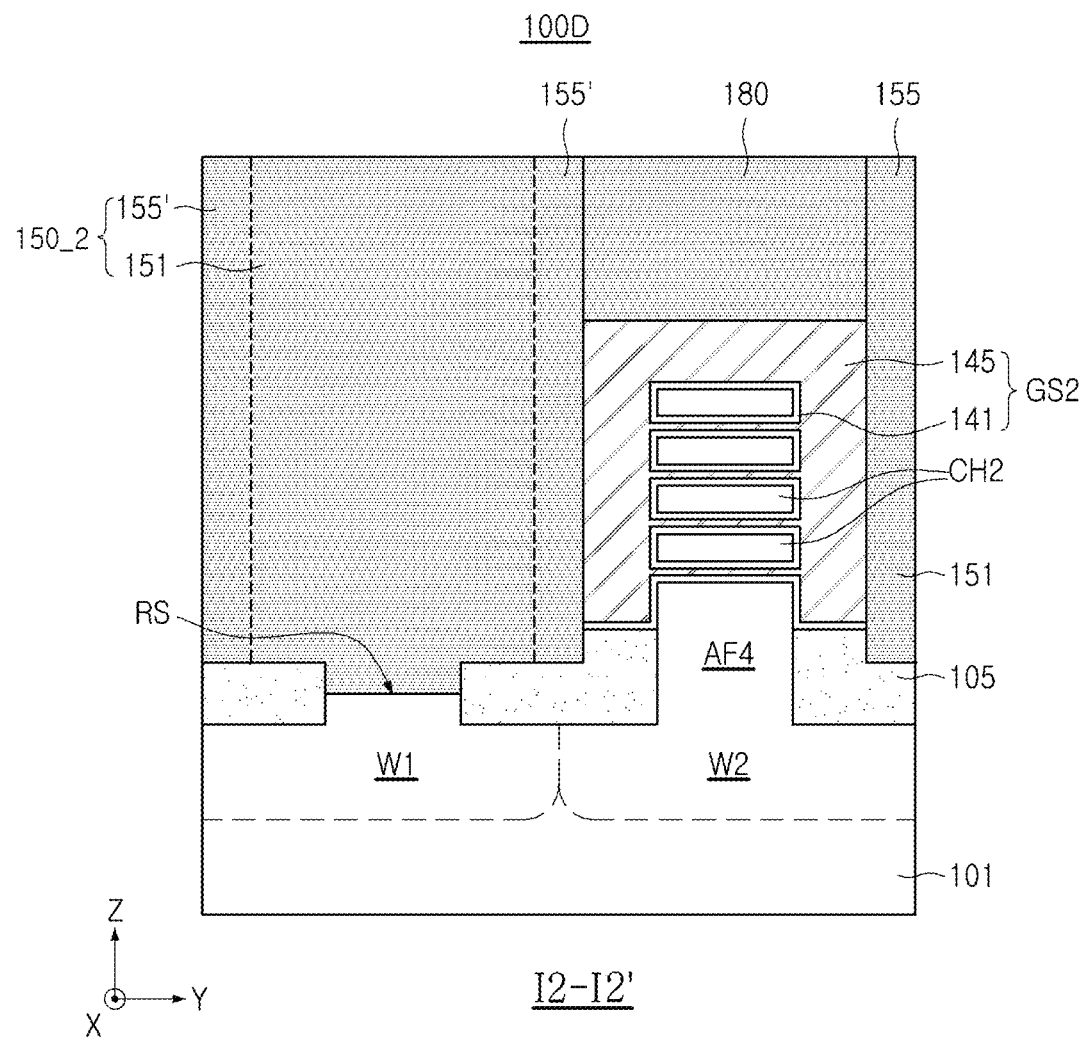
Figure 21A:
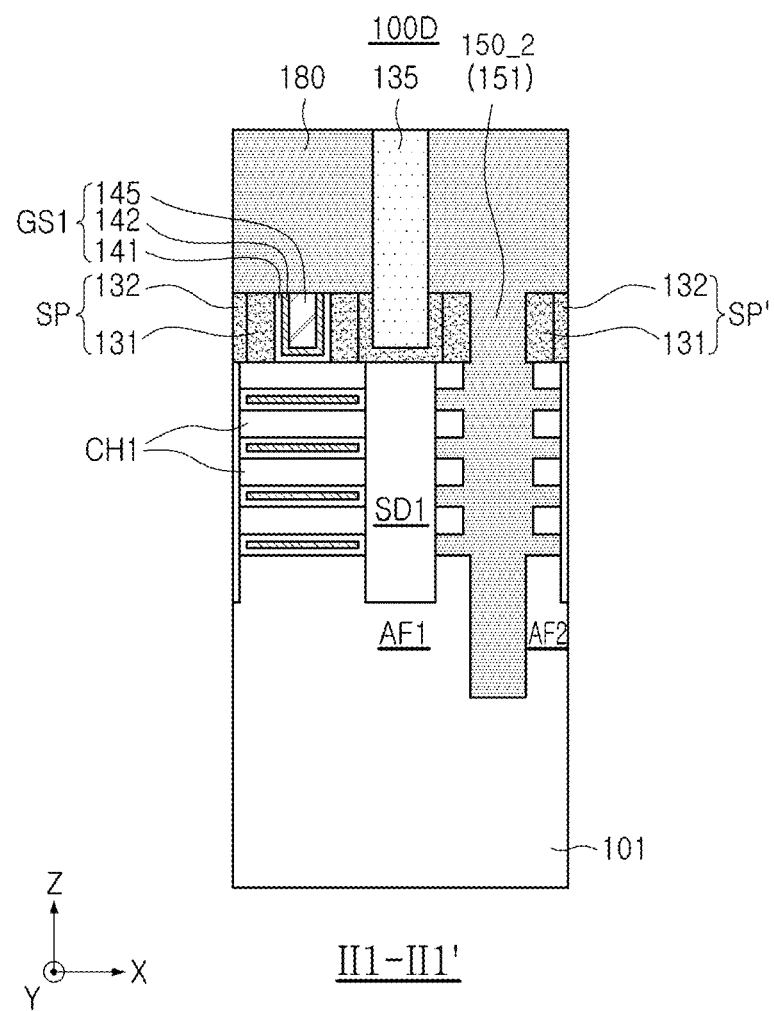
FIGS. 21A and 21B are cross-sectional views of the semiconductor device illustrated in FIG. 19, taken along lines II1-II1' and II2-II2', respectively.
Figure 21B:
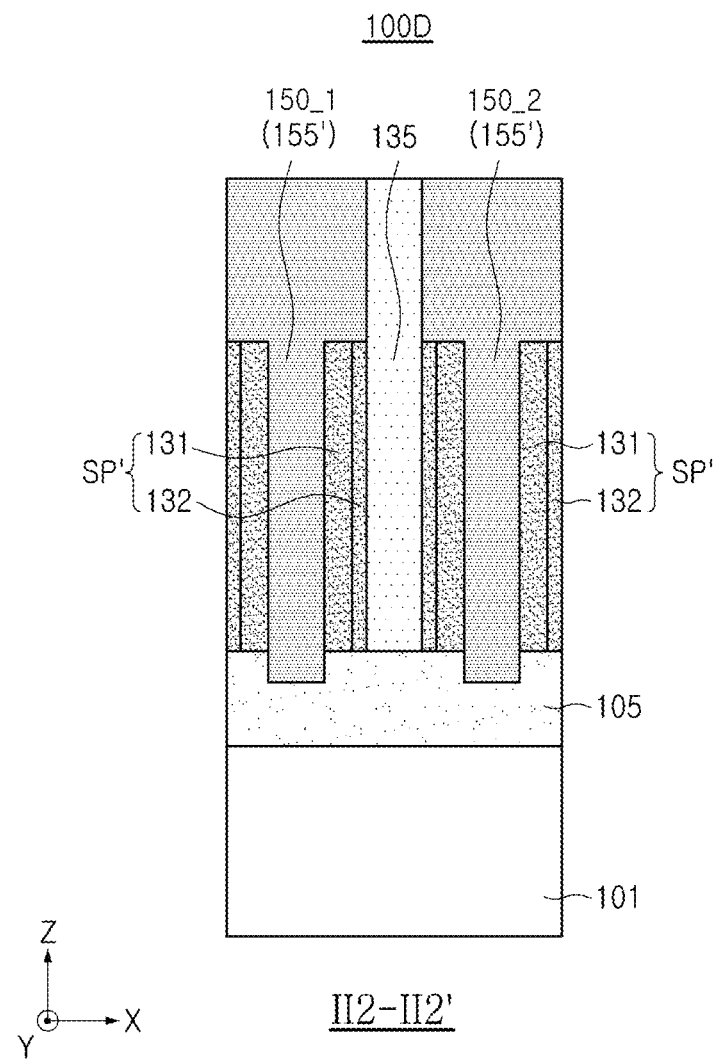

FIG. 19 is a plan view illustrating a semiconductor device according to an example embodiment, and FIGS. 20A and 20B are cross-sectional views of the semiconductor device illustrated in FIG. 19, taken along lines I1-I1' and I2-I2', respectively. FIGS. 21A and 21B are cross-sectional views of the semiconductor device illustrated in FIG. 19, taken along lines II1-II1' and II2-II2', respectively.

Referring to FIGS. 19, 20A, 20B, 21A, and 21B, a semiconductor device 100E according to the present example embodiment may be understood to be similar to the semiconductor device 100 illustrated in FIGS. 1, 2A to 2C, 3A and 3B, except for employing two field separation layers 150_1 and 150_2 that are diagonally arranged in a plan view (FIG. 19). In addition, the components of this embodiment may refer to the descriptions of the same or similar components of the semiconductor device 100 illustrated in FIGS. 1, 2A to 2C, 3A and 3B unless otherwise specified.

The semiconductor device 100E according to the present embodiment may include first and second active fins AF1 and AF2 respectively extending in a first direction (e.g., X-direction) on a substrate 101 and arranged on a first line, third and fourth active fins AF3 and AF4 respectively extending in the first direction on the substrate and arranged on a second line, a device isolation film 105 on the substrate and surrounding a portion of each of the first to fourth active fins AF1 to AF4, and first and second gate structures GS1 and GS2 intersecting the first and fourth active fins AF1 and AF4, respectively, and extending in a second direction intersecting the first direction.

A first recess RS1 positioned between the first and second active fins AF1 and AF2 is on the same line as the second gate structure GS2 in the second direction (refer to FIG. 20B), and a second recess RS2 positioned between the third and fourth active fins AF3 and AF4 is on the same line as the first gate structure GS1 in the second direction (refer to FIG. 20A).

First and second field separation layers 150_1 and 150_2 are diagonally arranged in a plan view (FIG. 19) and may be between the first and second active fins AF1 and AF2 and between the third and fourth active fins AF3 and AF4, respectively.

Referring to FIG. 20B, the first field separation layer 150_1 may include a first portion positioned in the first recess RS1, and a second portion extending from the first portion on an upper surface of the device isolation film 105 in the second direction (e.g., Y direction). Referring to FIG. 20A, the second field separation layer 150_2 may include a third portion located in the second recess RS2, and a fourth portion extending from the third portion on the upper surface of the device isolation film 105 in the second direction.

In the present embodiment, each of the first and second recesses RS1 and RS2 has a bottom surface that is lower than the upper surface of the device isolation film 105, and regions of the upper surface of the device isolation film 105, in which the second and fourth portions are located, may have a flat surface.

In another example, referring to FIGS. 20A, 21A and 21B, the first field separation layer 150_1 may include a diffusion break 151 positioned in the first recess RS1 and extending to an adjacent upper surface region of the device isolation film 105, and a separation region 155' on the upper surface of the device isolation film 105 and in contact with the first gate structure GS1. Similarly, referring to FIGS. 20B, 21A, and 21B, the second field separation layer 150_2 may include a diffusion break 151 positioned in the second recess RS2 and extending to an adjacent upper surface region of the device isolation film 105, and a separation region 155' on the upper surface of the device isolation film 105 and in contact with the second gate structure GS2.

Referring to FIG. 22, the first field separation layer 150_1 may have a region overlapping the second field separation layer 150_2 in the first direction (e.g., the X direction). An overlapping region of the first field separation layer 150_1 and the second field separation layer 150_2 may be the separation region 155'.

In the present embodiment, since the first and second field separation layers 150_1 and 150_2 are formed together with the gate isolation pattern 155 and the separation region 155', the exposure of the interlayer insulating layer 135 during the process of forming the gate isolation pattern of the related art (in detail, a region indicated by WT) may be prevented. The photolithography process may be simplified.

As set forth above, in some embodiments, after removing the dummy gate electrode, a field separation layer (in detail, a diffusion break) for cutting the fin structure may be formed together with the gate isolation pattern for separating the gate structure. Since the shadowing effect caused by the gate isolation pattern may be eliminated, the field separation layer may be formed without undercutting. Since the interlayer insulating layer is protected by an ILD protective layer (e.g., SiN) during the formation of the field separation layer, loss of the interlayer insulating layer may be prevented even under scaled conditions. In some embodiments, a material of the upper/lower region of the field separation layer may be adjusted, thereby using a stress relief structure.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
    a substrate including a first active fin and a second active fin each extending in a first direction and arranged on a first line, the substrate having a recess between the first active fin and the second active fin;
    a device isolation film on the substrate and surrounding a first portion of the first active fin and a second portion of the second active fin;
    a first gate structure and a second gate structure on the first active fin and the second active fin, respectively, and extending in a second direction, intersecting the first direction; and
    a field separation layer having a first portion located between the first active fin and the second active fin and in the recess, and a second portion extending from both sides of the first portion in the second direction to an upper surface of the device isolation film,
    wherein the recess has a bottom surface lower in a third direction intersecting the first direction and the second direction than the upper surface of the device isolation film, and
    a first region of the upper surface of the device isolation film, in which the second portion of the field separation layer is located, has a flat surface and is lower in the third direction than a second region of the upper surface of the device isolation film in which the first and second gate structures are positioned.

2. The semiconductor device of claim 1, wherein a width of the field separation layer in the first direction is greater than a width of each of the first and second gate structures in the first direction.

3. The semiconductor device of claim 1, wherein each of the first and second gate structures includes a gate electrode respectively intersecting the first active fin and the second active fin in the second direction, a gate insulating layer between each of the first active fin and the second active fin and the gate electrode, and a pair of gate spacers on two side surfaces of the gate electrode, opposing each other in the first direction, respectively, among side surfaces of the gate electrode.

4. The semiconductor device of claim 3, further comprising a pair of sidewall spacers on two side surfaces opposing each other in the first direction, among side surfaces of the field separation layer, respectively,
    wherein the pair of sidewall spacers includes a same material as a material of the pair of gate spacers.

5. The semiconductor device of claim 4, wherein the pair of sidewall spacers are on a region of the upper surface of the device isolation film, adjacent to the recess.

6. The semiconductor device of claim 1, further comprising first source/drain regions on the first active fin on both sides of the first gate structure, respectively, and second source/drain regions on the second active fin on both sides of the second gate structure, respectively.

7. The semiconductor device of claim 6, wherein the first portion of the field separation layer is located between adjacent first and second source/drain regions among the first and second source/drain regions and has a lower surface lower in the third direction than lower surfaces of the first and second source/drain regions.

8. The semiconductor device of claim 1, further comprising,
    a third active fin spaced apart from the first active fin in the second direction, and extending in the first direction,
    a third gate structure on the third active fin, extending in the second direction, and on a same line as the first gate structure, and
    a gate isolation pattern between the first and second gate structures.

9. The semiconductor device of claim 8, wherein the gate isolation pattern has a lower surface on a same level in the third direction as a lower surface of the second portion of the field separation layer.

10. The semiconductor device of claim 8, wherein the gate isolation pattern includes a same material as a material of the field separation layer.

11. The semiconductor device of claim 1, wherein the field separation layer includes silicon nitride ($SiN_a$), silicon oxynitride ($SiO_bN_c$), silicon carbonitride ($SiC_dN_e$), or silicon oxycarbonitride ($SiO_xC_yN_z$).

12. The semiconductor device of claim 1, wherein the field separation layer includes a lower region including a first insulating material, and an upper region including a second insulating material different from the first insulating material.

13. The semiconductor device of claim 12, wherein the first insulating material includes silicon oxide ($SiO_x$), and the second insulating material includes silicon nitride ($SiN_a$), silicon oxynitride ($SiO_bN_c$), silicon carbonitride ($SiC_dN_e$), or silicon oxycarbonitride ($SiO_xC_yN_z$).

14. The semiconductor device of claim 1, wherein the first active fin and the second active fin include a plurality of channel layers spaced apart from each other in a direction, perpendicular to an upper surface of the substrate, and the first and second gate structures include a gate electrode extending in the second direction while surrounding the plurality of channel layers, and a gate insulating layer between the plurality of channel layers and the gate electrode.

15. A semiconductor device comprising:

a substrate;

a first active fin and a second active fin respectively extending in a first direction on the substrate, and arranged in a second direction intersecting the first direction;

a device isolation film on the substrate and surrounding a portion of each of the first active fin and the second active fin;

first and second recesses positioned adjacent to one end of the first active fin and one end to the second active fin in the substrate, respectively, and arranged on a same line in the second direction, each of the first and second recesses having a bottom surface lower in a third direction intersecting the first direction and the second direction than an upper surface of the device isolation film;

first and second gate structures intersecting the first active fin and the second active fin, respectively, and extending in the second direction, the first and second gate structures arranged on a same line as each other in the second direction;

a field separation layer having first portions positioned in the first and second recesses, and second portions extending from the first portions in the second direction on the upper surface of the device isolation film, first regions of the upper surface of the device isolation film, in which the second portions are located, having a flat surface; and a gate isolation pattern between the first and second gate structures and including a same material as a material of the field separation layer.

16. The semiconductor device of claim 15, wherein the first regions of the upper surface of the device isolation film are lower in the third direction than second regions of the upper surface of the device isolation film in which the first and second gate structures are positioned.

17. The semiconductor device of claim 16, wherein the gate isolation pattern has a lower surface on a same level in the third direction as a lower surface of the second portions of the field separation layer.

18. The semiconductor device of claim 15, wherein the field separation layer has a region overlapping the gate isolation pattern in the first direction.

19. A semiconductor device comprising:

a substrate;

a first active fin and a second active fin respectively extending in a first direction on the substrate, and on a first line;

a third active fin and a fourth active fin respectively extending in the first direction on the substrate, and on a second line, the third active fin and the fourth active fin overlapping the first active fin and the second active fin, respectively, in a second direction intersecting the first direction;

a device isolation film on the substrate and surrounding a portion of each of the first to fourth active fins;

first and second gate structures intersecting the first and fourth active fins, respectively, and extending in the second direction;

a first recess positioned between the first active fin and the second active fin in the substrate, and on a third line with the second gate structure in the second direction;

a second recess positioned between the third and fourth active fins in the substrate and on a fourth line with the first gate structure in the second direction;

a first field separation layer having a first portion positioned in the first recess, and a second portion extending from the first portion on an upper surface of the device isolation film in the second direction, the second portion having a first gate isolation pattern connecting the second gate structure; and a second field separation layer having a third portion positioned in the second recess, and a fourth portion extending from the third portion on the upper surface of the device isolation film in the second direction, the fourth portion having a second gate isolation pattern connecting the first gate structure, wherein each of the first and second recesses has a bottom surface lower in a third direction intersecting the first direction and the second direction than the upper surface of the device isolation film, and regions of the upper surface of the device isolation film, in which the second and fourth portions are located, have flat surfaces, the first gate isolation pattern overlapping the second gate isolation pattern in the first direction.

* * * * *